(12) United States Patent
Park et al.

(10) Patent No.: US 8,098,148 B2
(45) Date of Patent: Jan. 17, 2012

(54) SENSOR SIGNAL PROCESSOR APPARATUS

(75) Inventors: Ji Man Park, Daejeon (KR); Sung Ik Jun, Daejeon (KR); Young Soo Park, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 457 days.

(21) Appl. No.: 12/445,785

(22) PCT Filed: Oct. 15, 2007

(86) PCT No.: PCT/KR2007/005028
§ 371 (c)(1),
(2), (4) Date: Apr. 16, 2009

(87) PCT Pub. No.: WO2008/048024
PCT Pub. Date: Apr. 24, 2008

(65) Prior Publication Data
US 2010/0315194 A1 Dec. 16, 2010

(30) Foreign Application Priority Data
Oct. 20, 2006 (KR) .................. 10-2006-0102249
Feb. 26, 2007 (KR) .................. 10-2007-0019228

(51) Int. Cl.
*G08B 23/00* (2006.01)
*G08B 29/00* (2006.01)

(52) U.S. Cl. ........ 340/500; 340/501; 340/509; 340/511; 340/661; 307/116

(58) Field of Classification Search ............. 340/500
See application file for complete search history.

(56) References Cited

U.S. PATENT DOCUMENTS

| 3,876,933 A * | 4/1975 | Herrington | 324/607 |
| 4,020,357 A * | 4/1977 | Punis | 250/568 |
| 4,337,456 A * | 6/1982 | Deffendall et al. | 341/118 |
| 6,831,580 B2 * | 12/2004 | Bae | 341/144 |
| 7,352,216 B2 * | 4/2008 | Hershbarger | 327/132 |

FOREIGN PATENT DOCUMENTS

| EP | 0495118 A1 | 7/1992 |
| JP | 05-010791 | 1/1993 |
| JP | 2005-003491 | 1/2005 |
| KR | 1020040092104 A | 11/2004 |

OTHER PUBLICATIONS

International Search Report for application PCT/KR2007/005028 filed Oct. 15, 2007.
Written Opinion of the International Searching Authority for application PCT/KR2007/005028 filed Oct. 15, 2007.

* cited by examiner

*Primary Examiner* — Donnie Crosland

(57) ABSTRACT

A sensor signal processor apparatus having good characteristics and providing an easy and simple interface for various sensors. The sensor signal processor apparatus includes a current source, a sensor, a ramp integrator, a comparator, and a controller. The current source generates a constant current according to a preset value, and the sensor outputs a sensor voltage using the current from the current source. The ramp integrator generates and outputs an integral voltage according to an input command, and the comparator compares the sensor voltage of the sensor with the integral voltage of the ramp integrator and outputting a result of the comparison. The controller controls the generating and outputting of the integral voltage of the ramp integrator according to the comparison result of the comparator.

24 Claims, 32 Drawing Sheets

[Fig. 1]
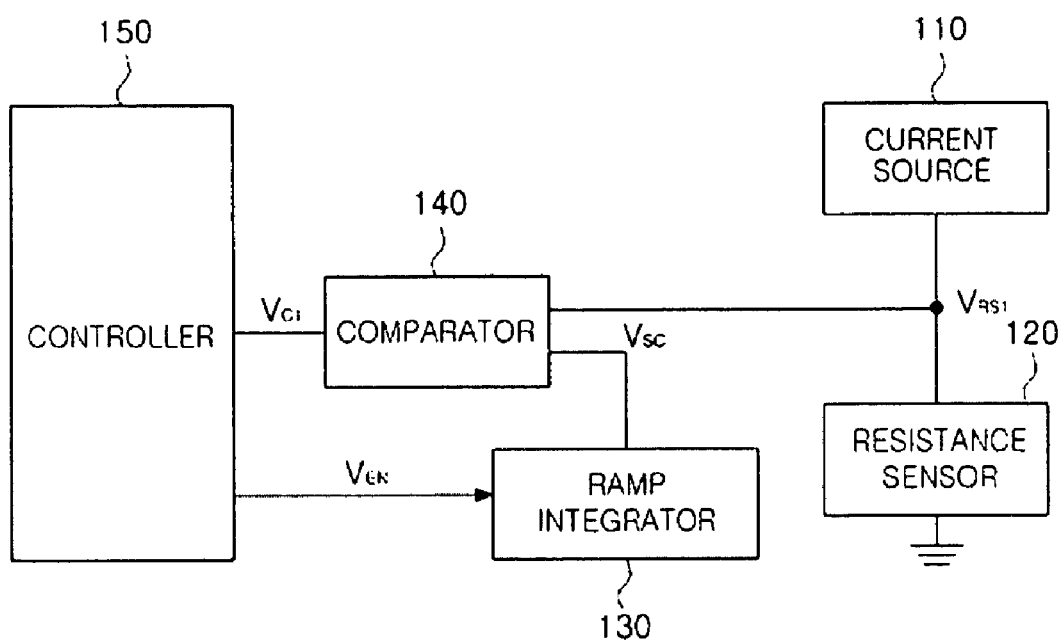

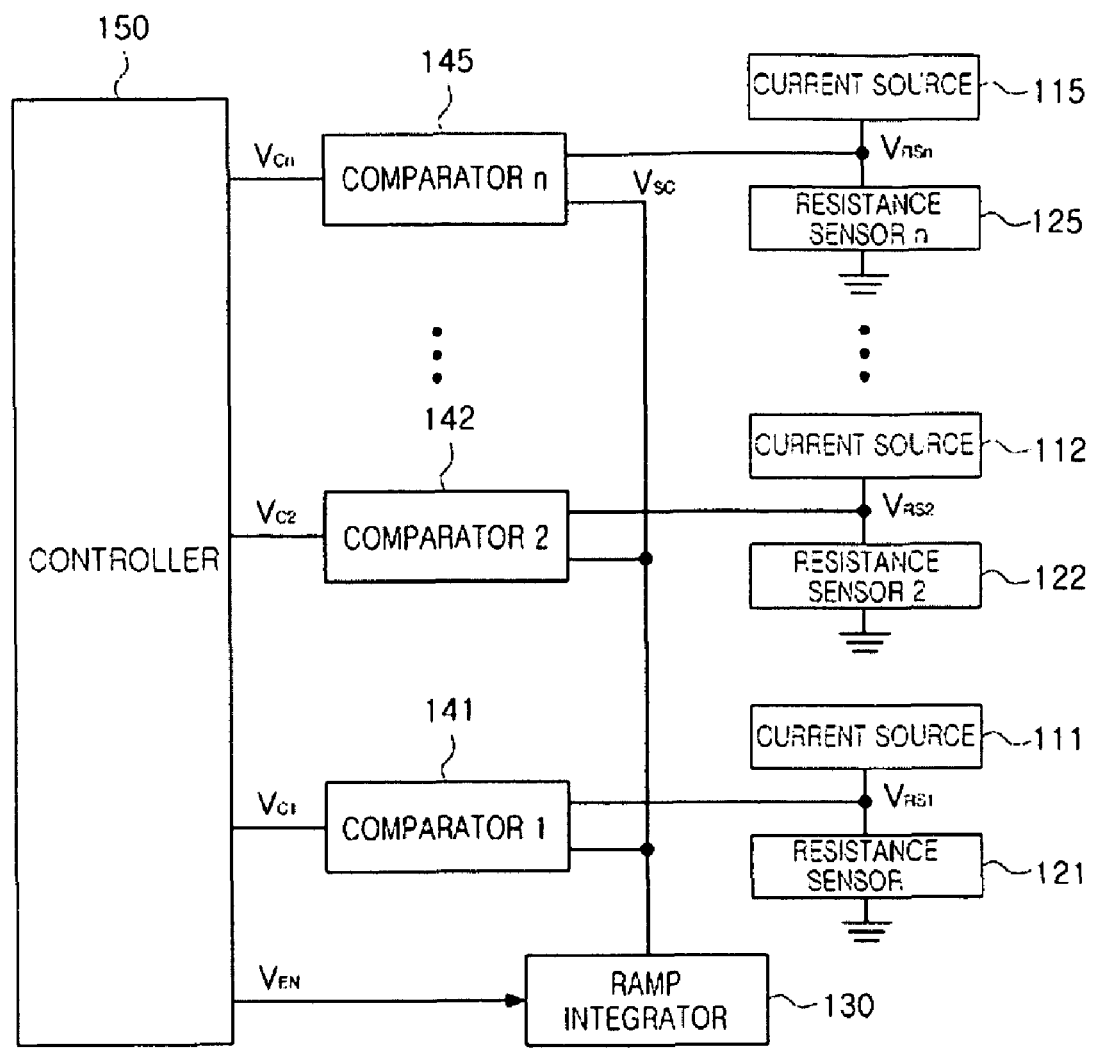
[Fig. 2]

[Fig. 3]
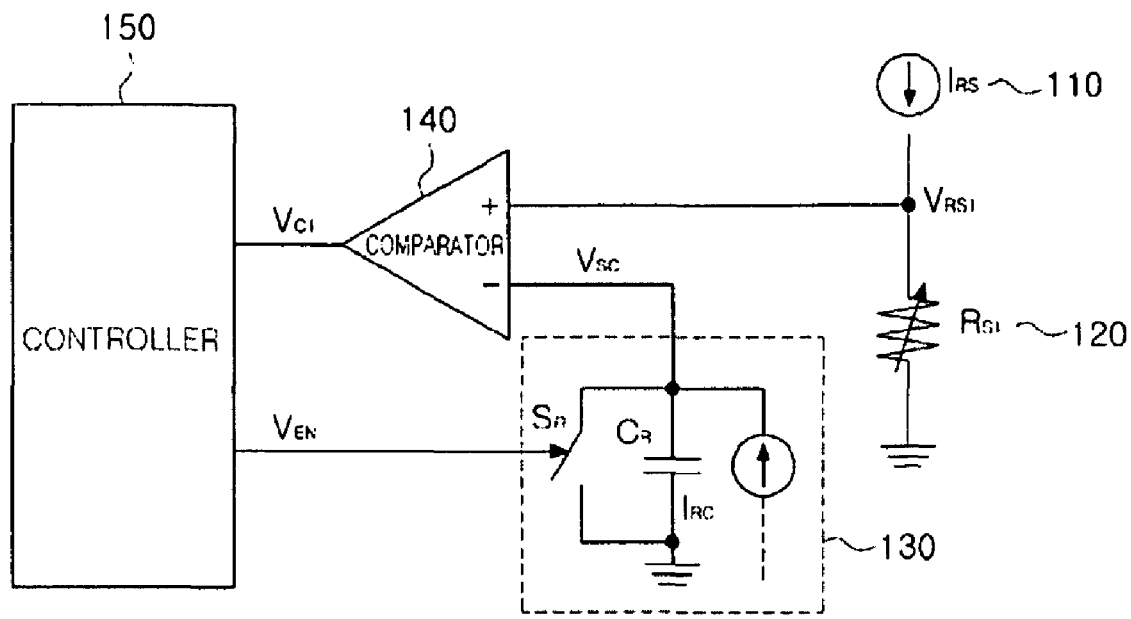

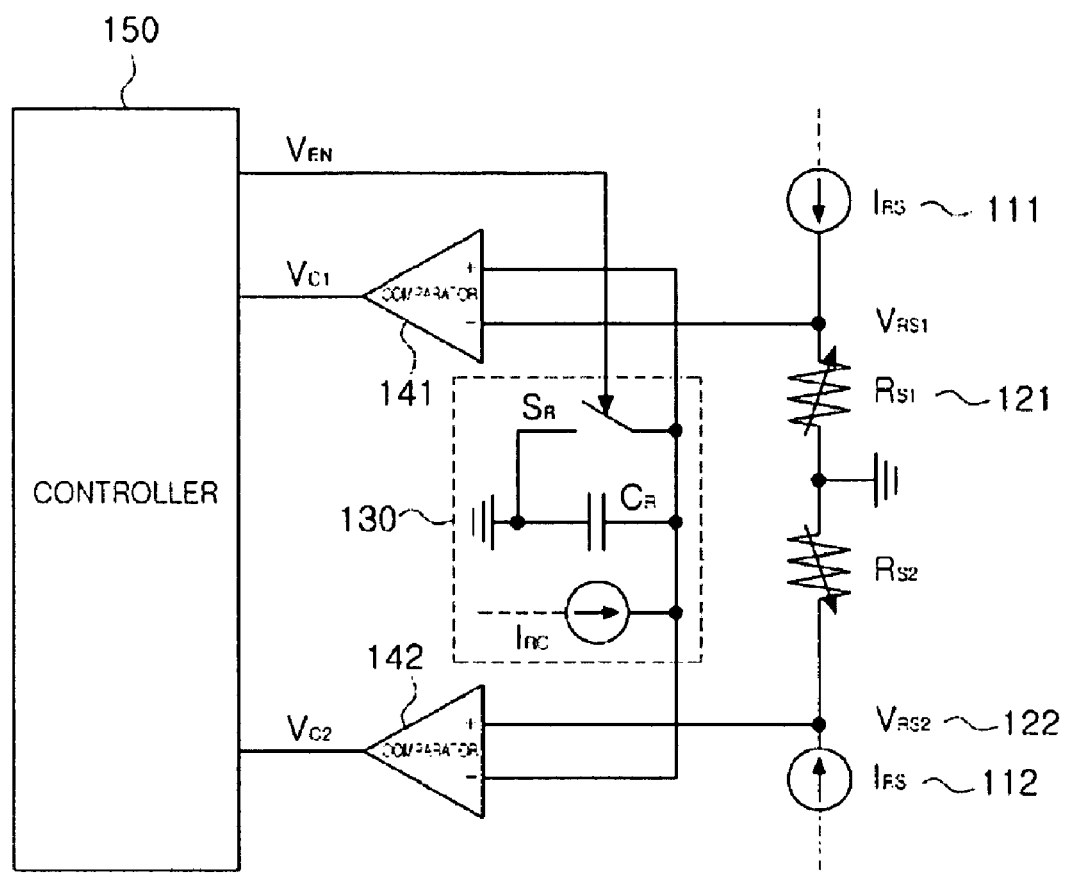
[Fig. 4]

[Fig. 5]
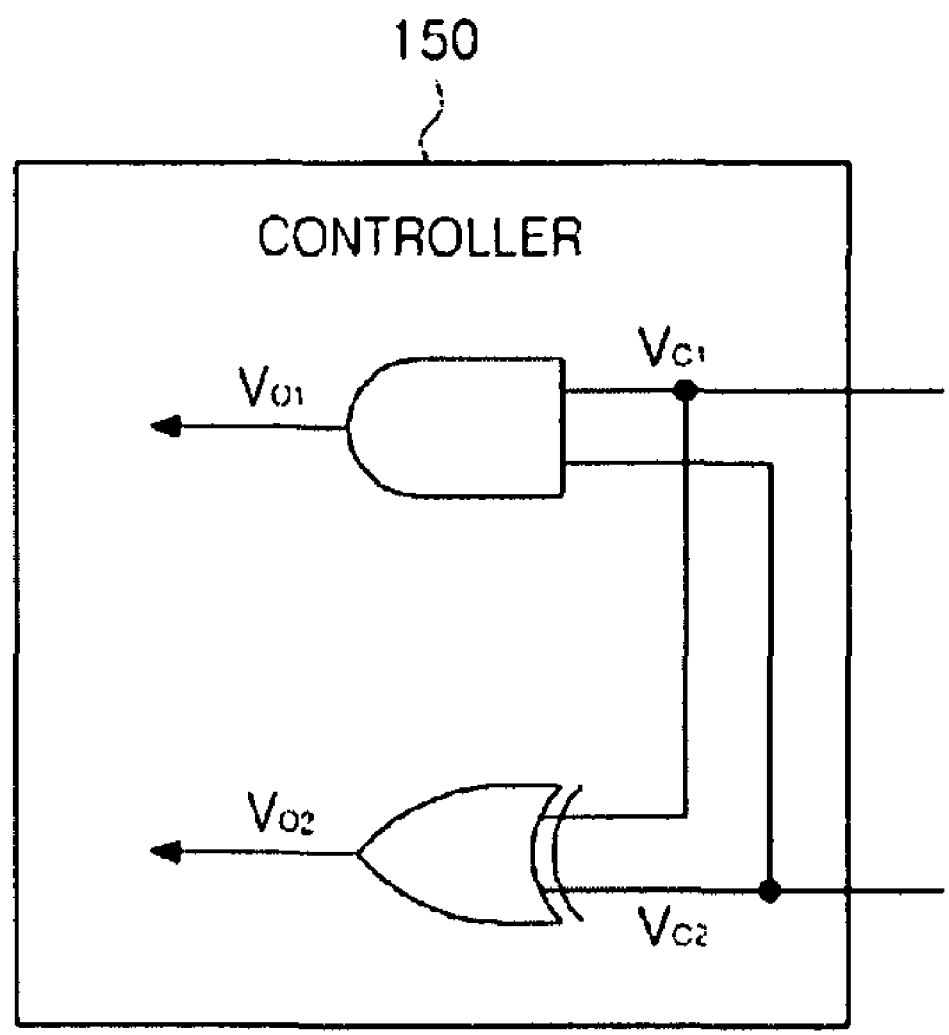

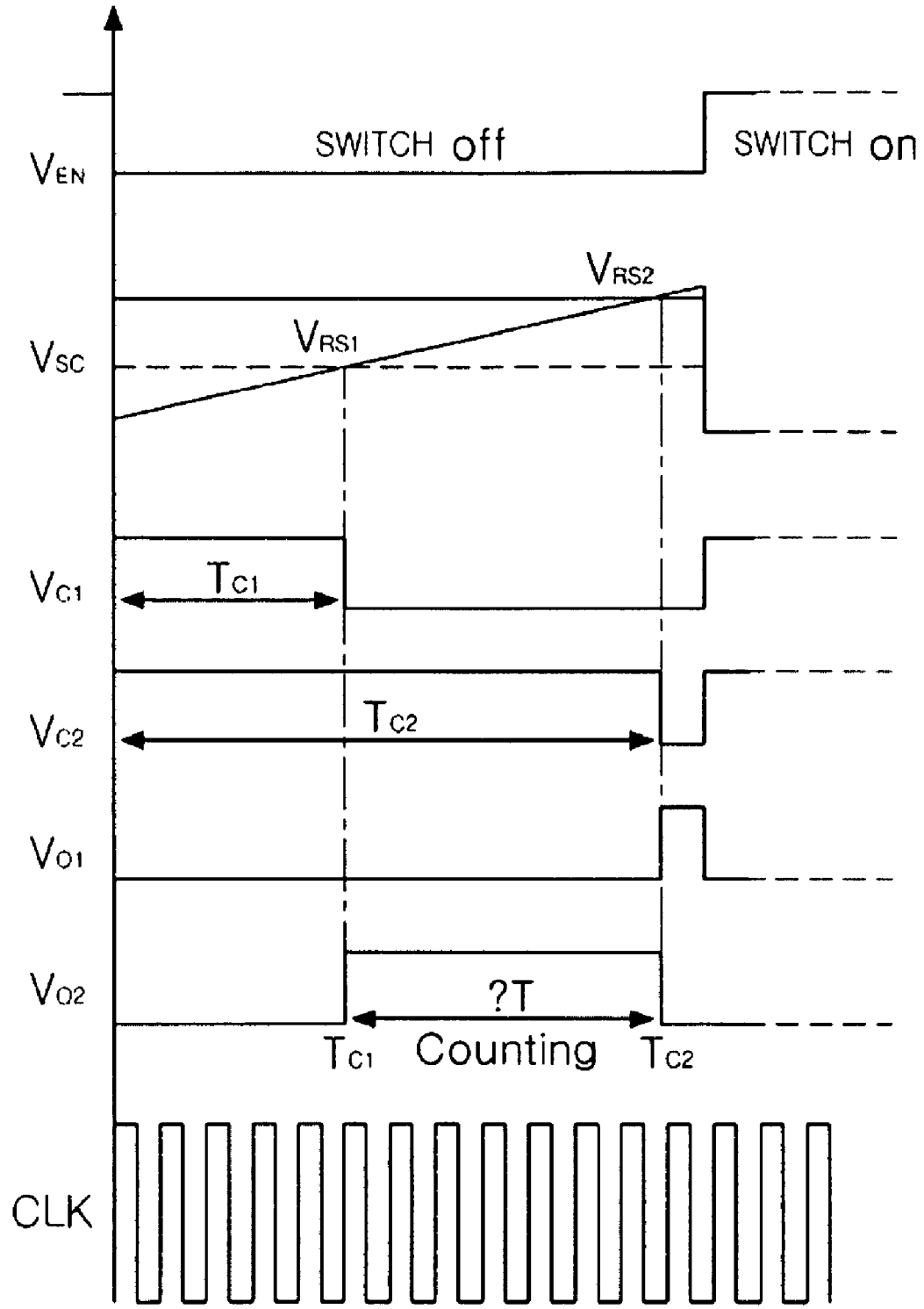
[Fig. 6]

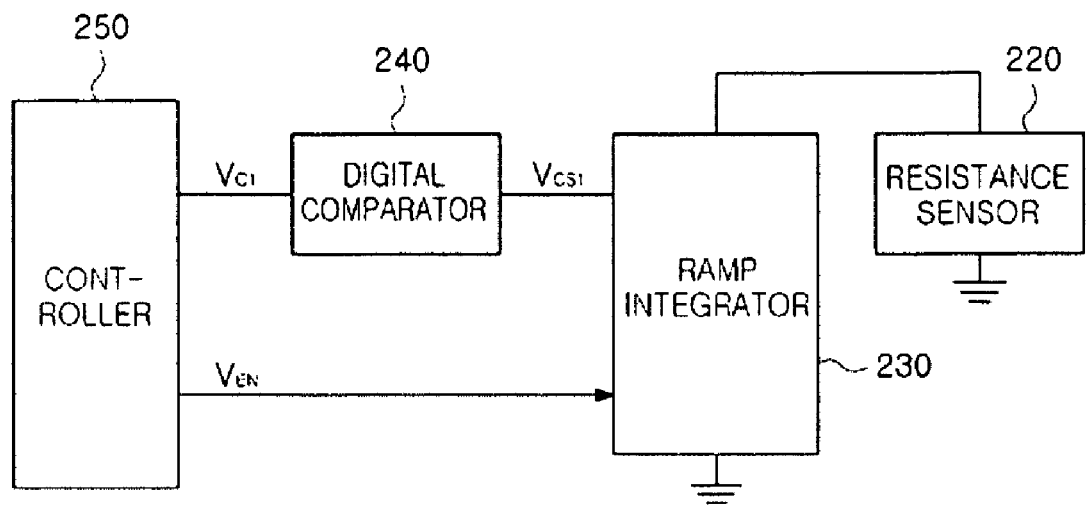
[Fig. 7]

[Fig. 8]
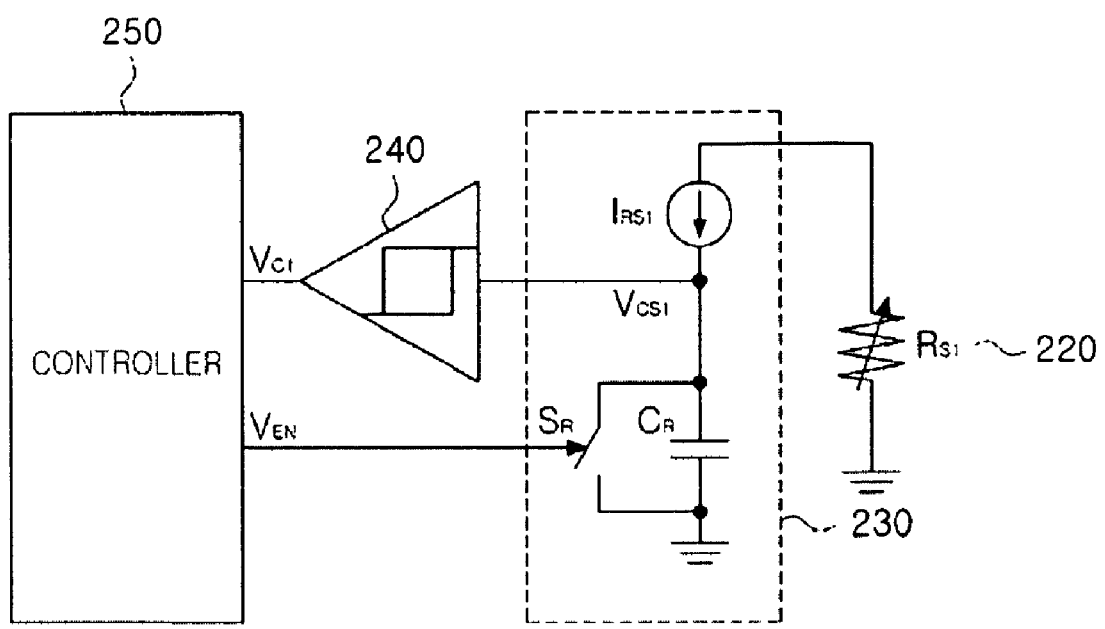

[Fig. 9]
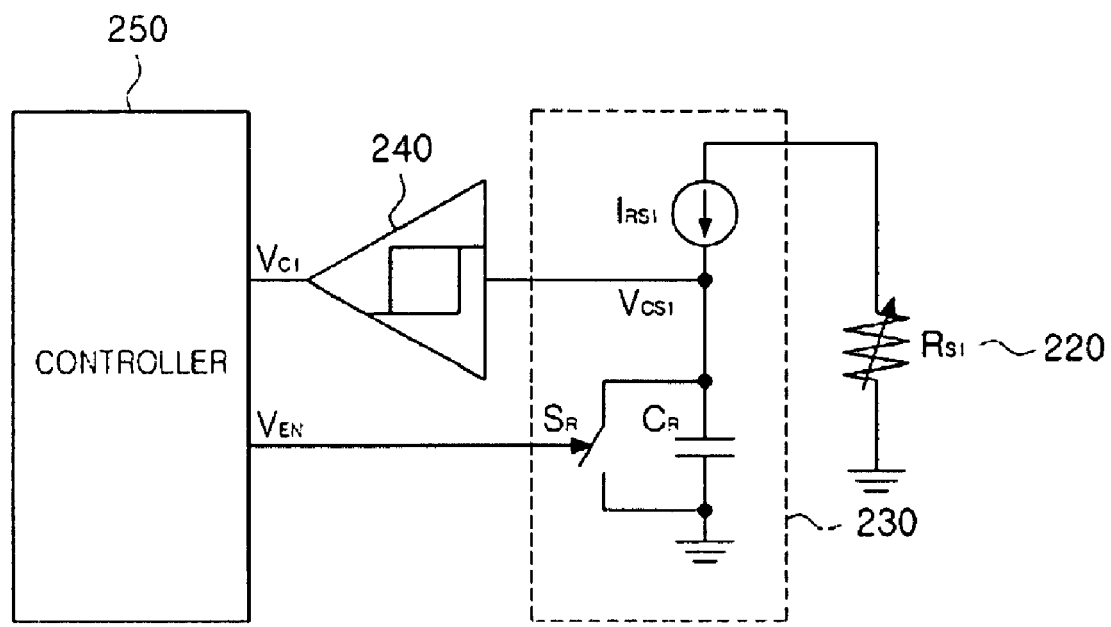

[Fig. 10]
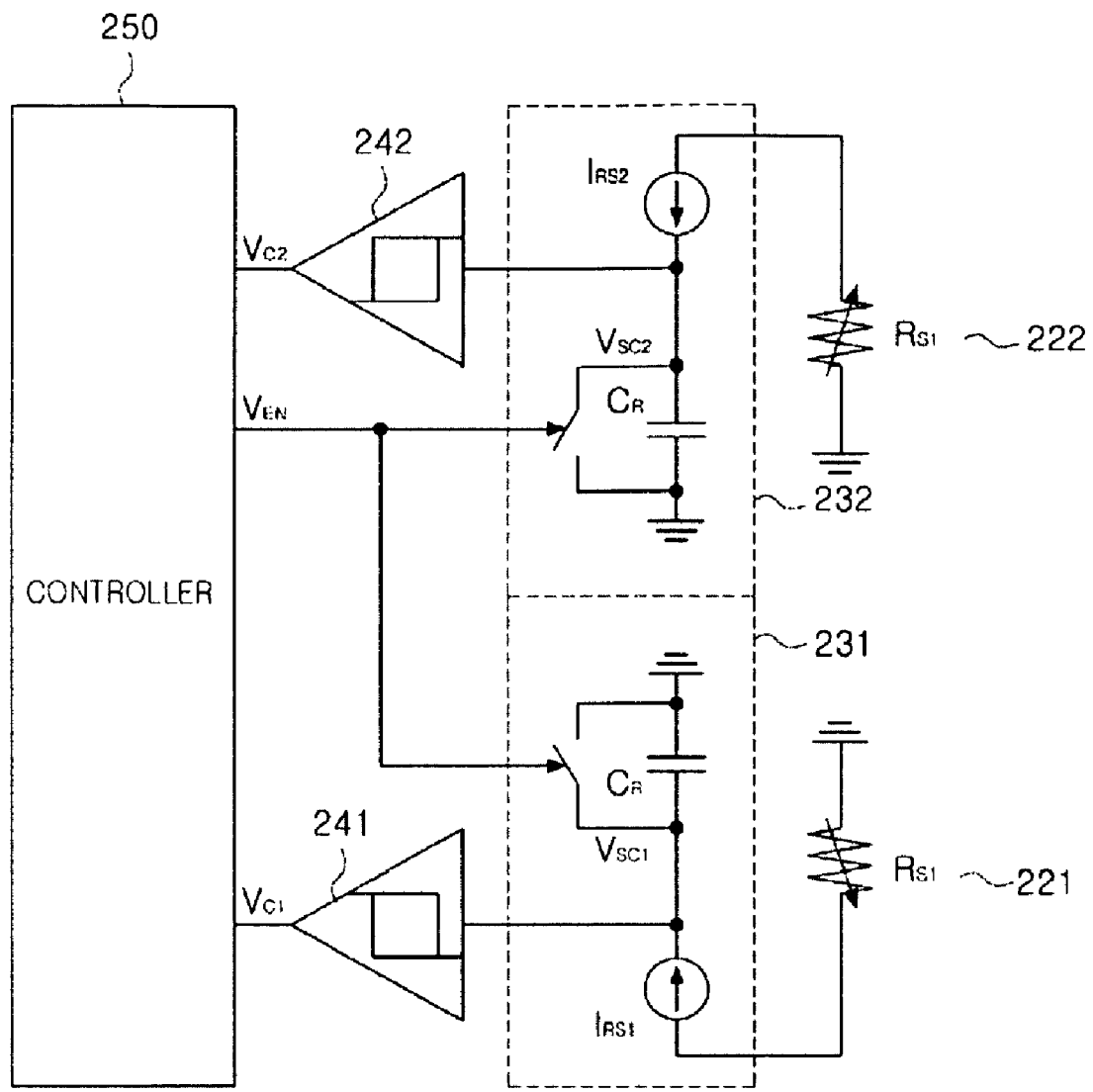

[Fig. 11]
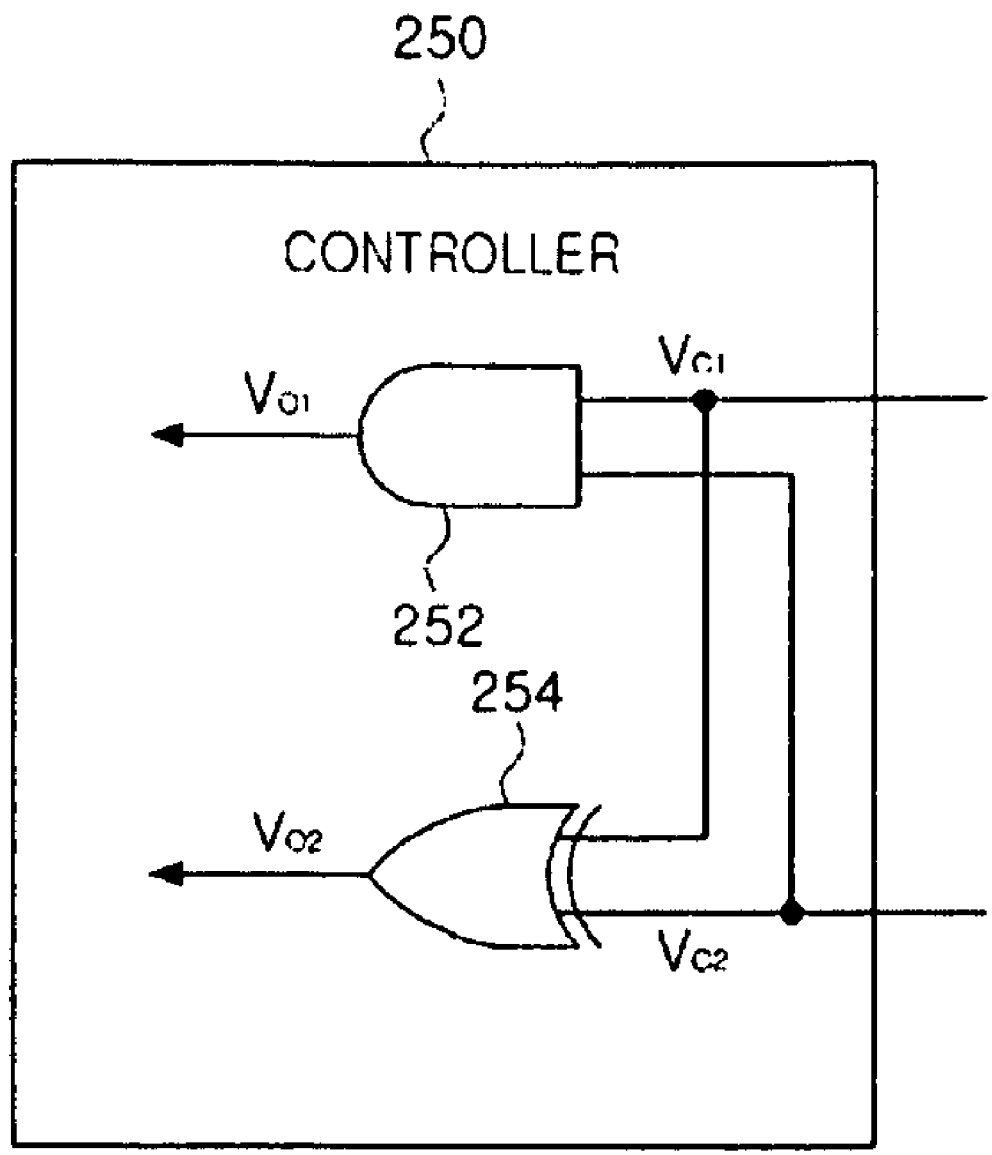

[Fig. 12]
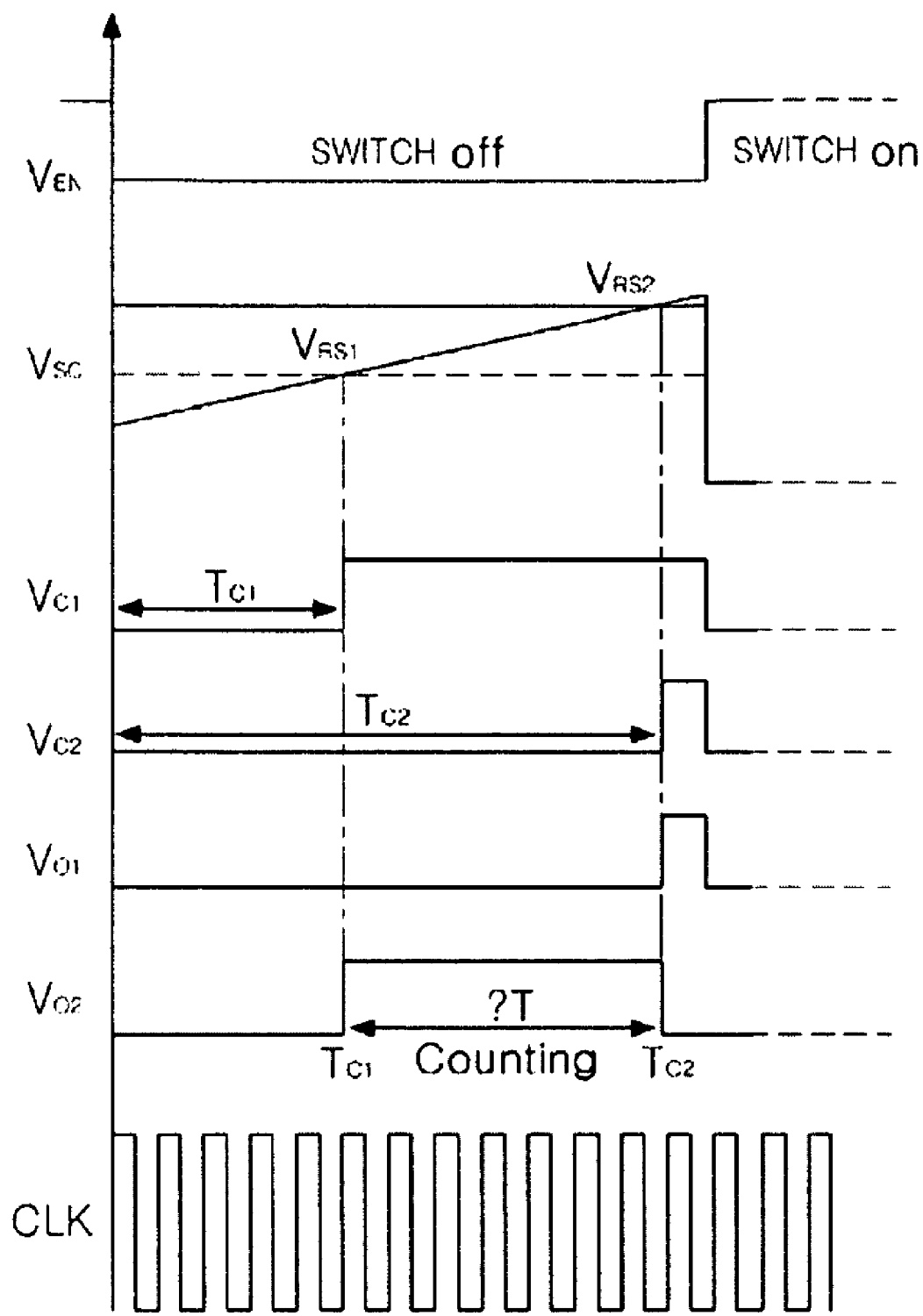

[Fig. 13]
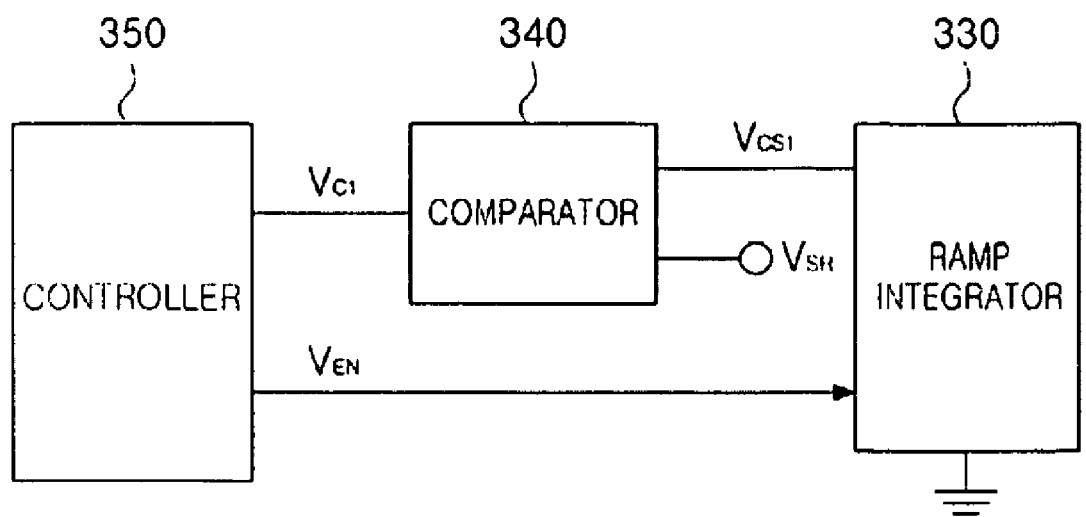

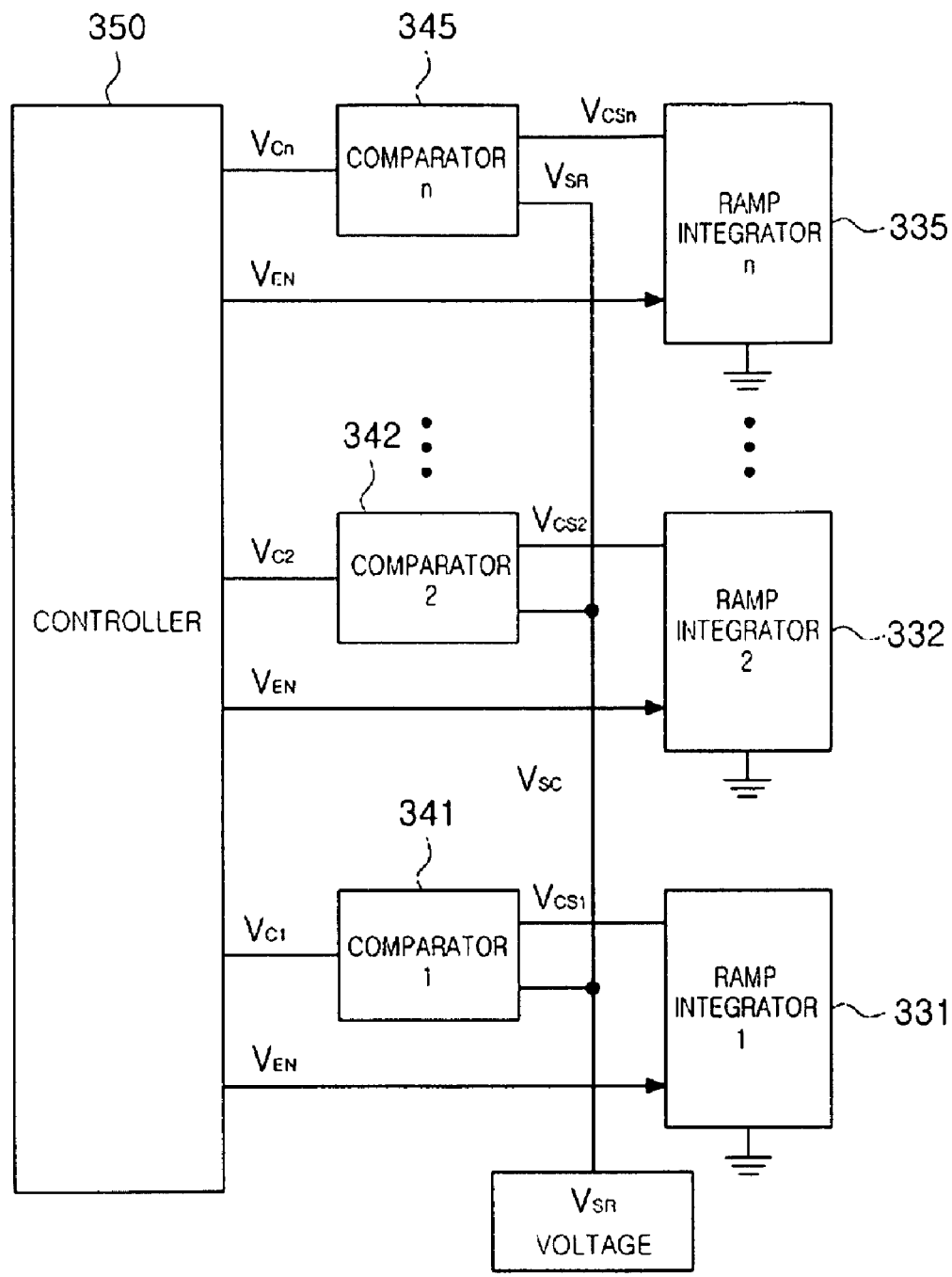
[Fig. 14]

[Fig. 15]
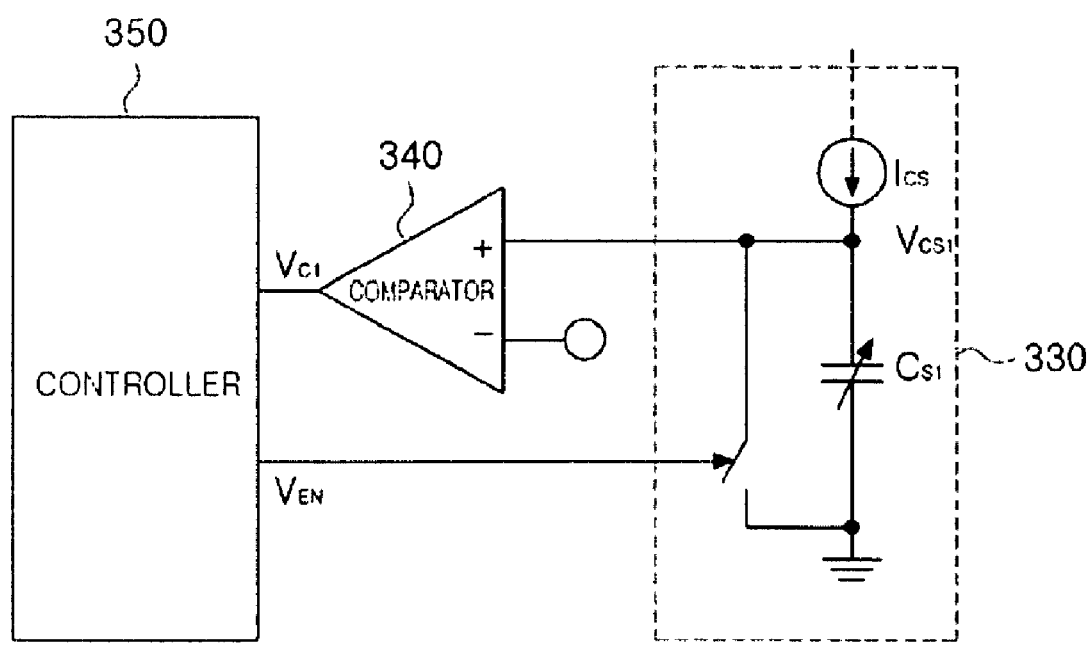

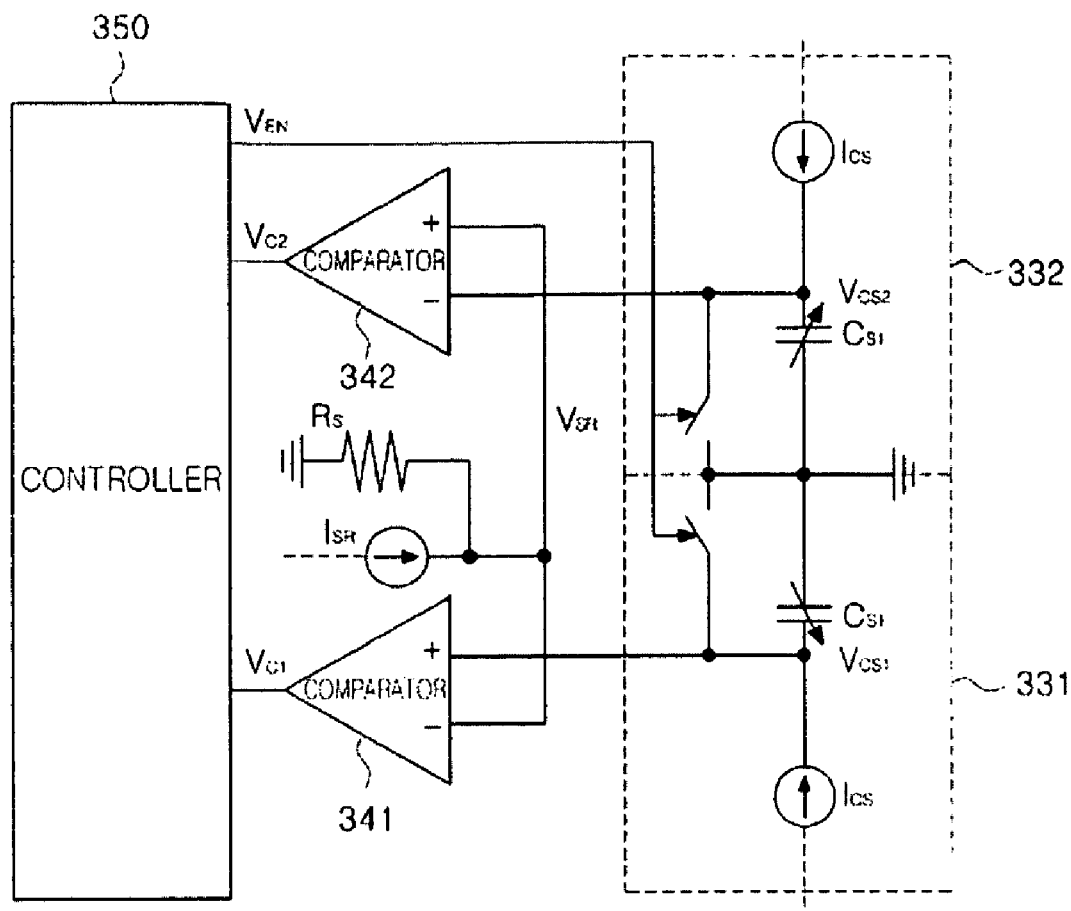
[Fig. 16]

[Fig. 17]
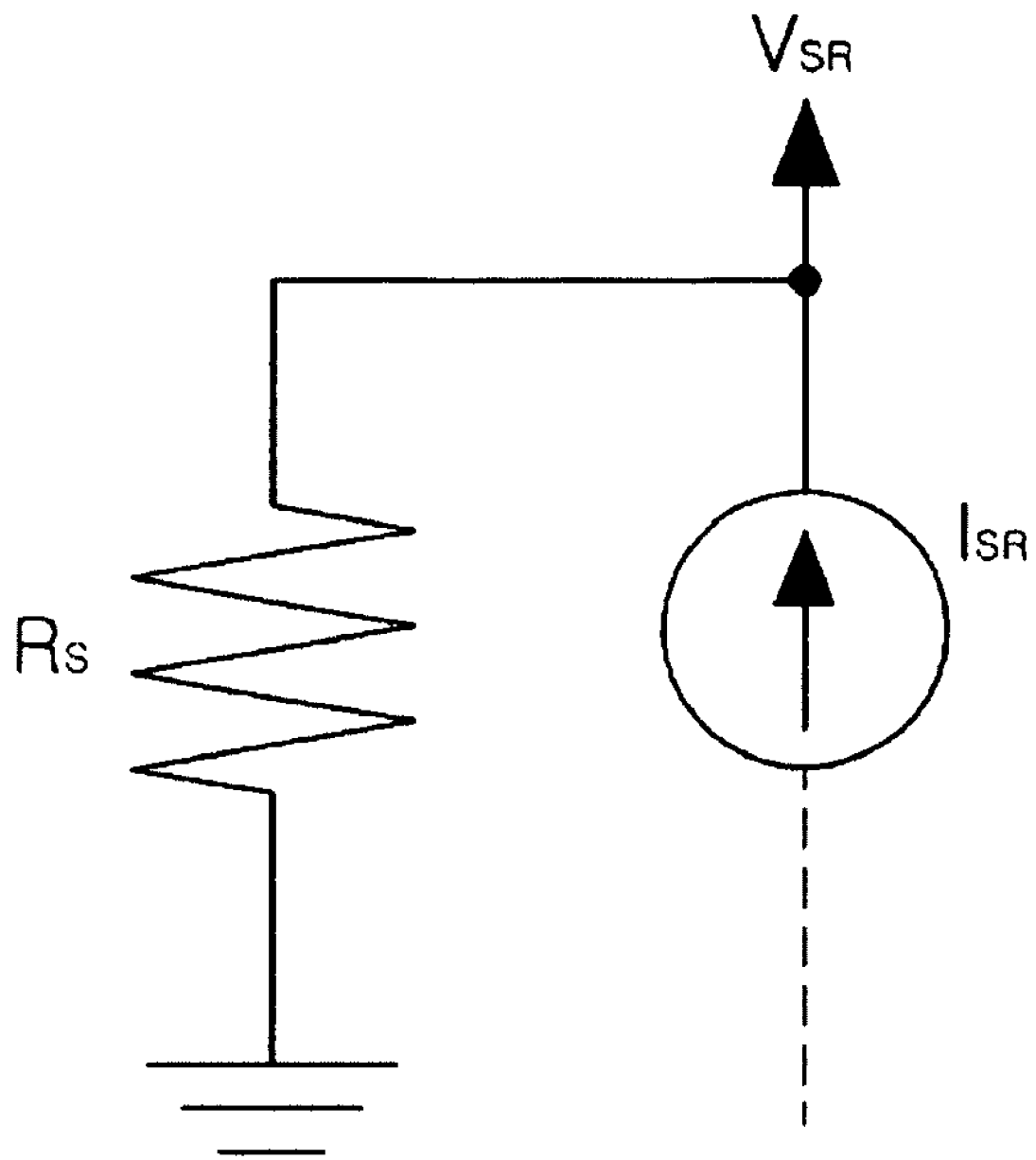

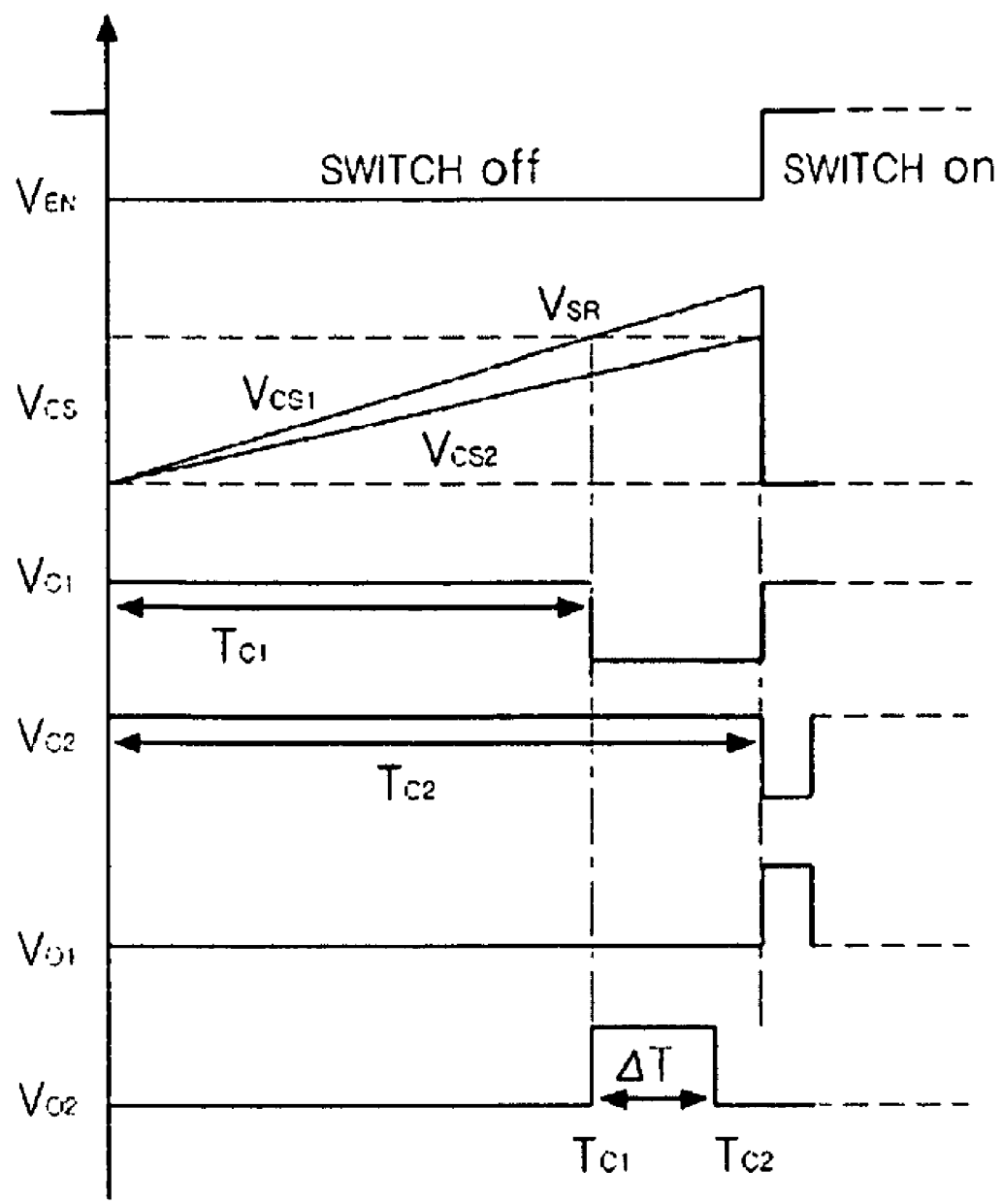
[Fig. 18]

[Fig. 19]
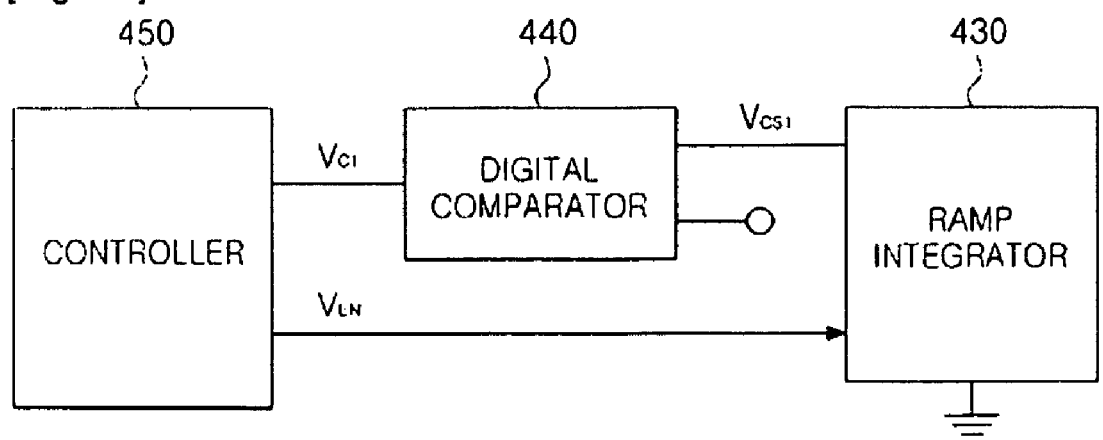

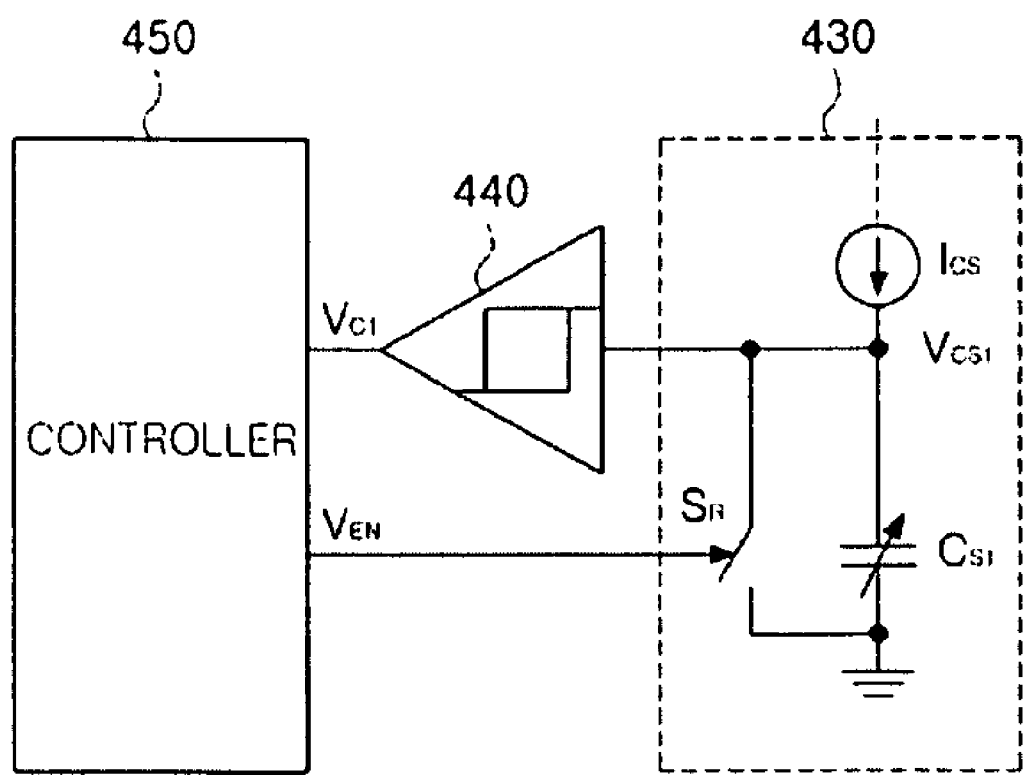
[Fig. 20]

[Fig. 21]
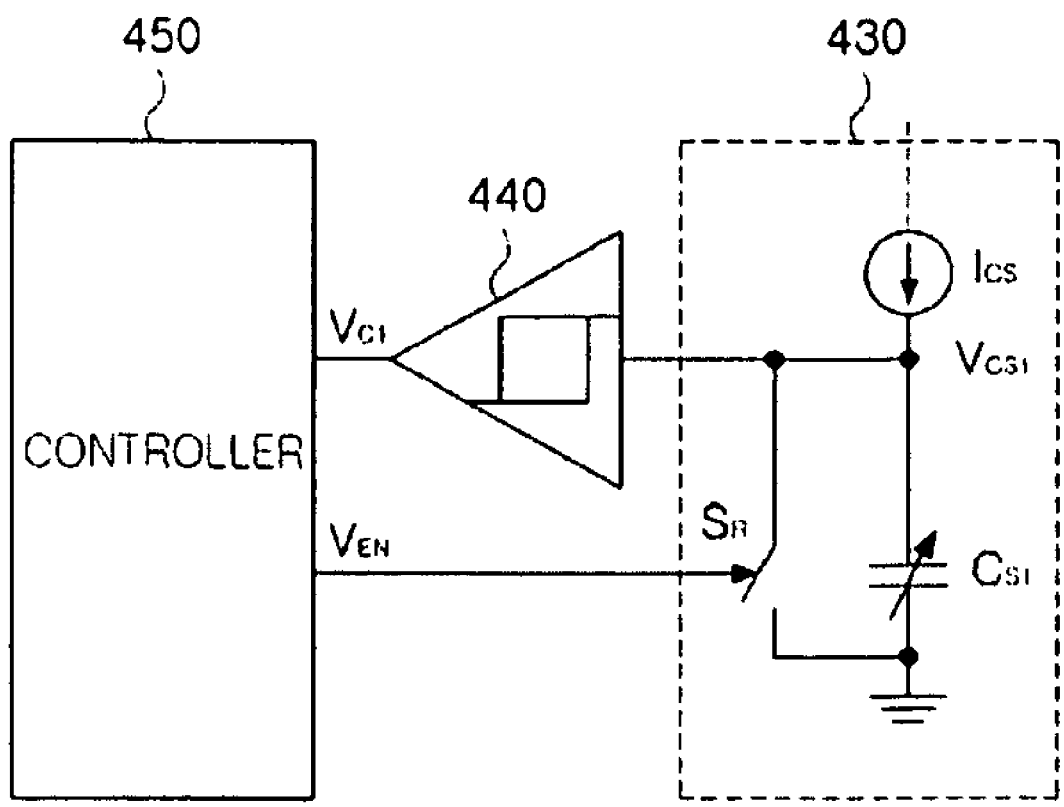

[Fig. 22]
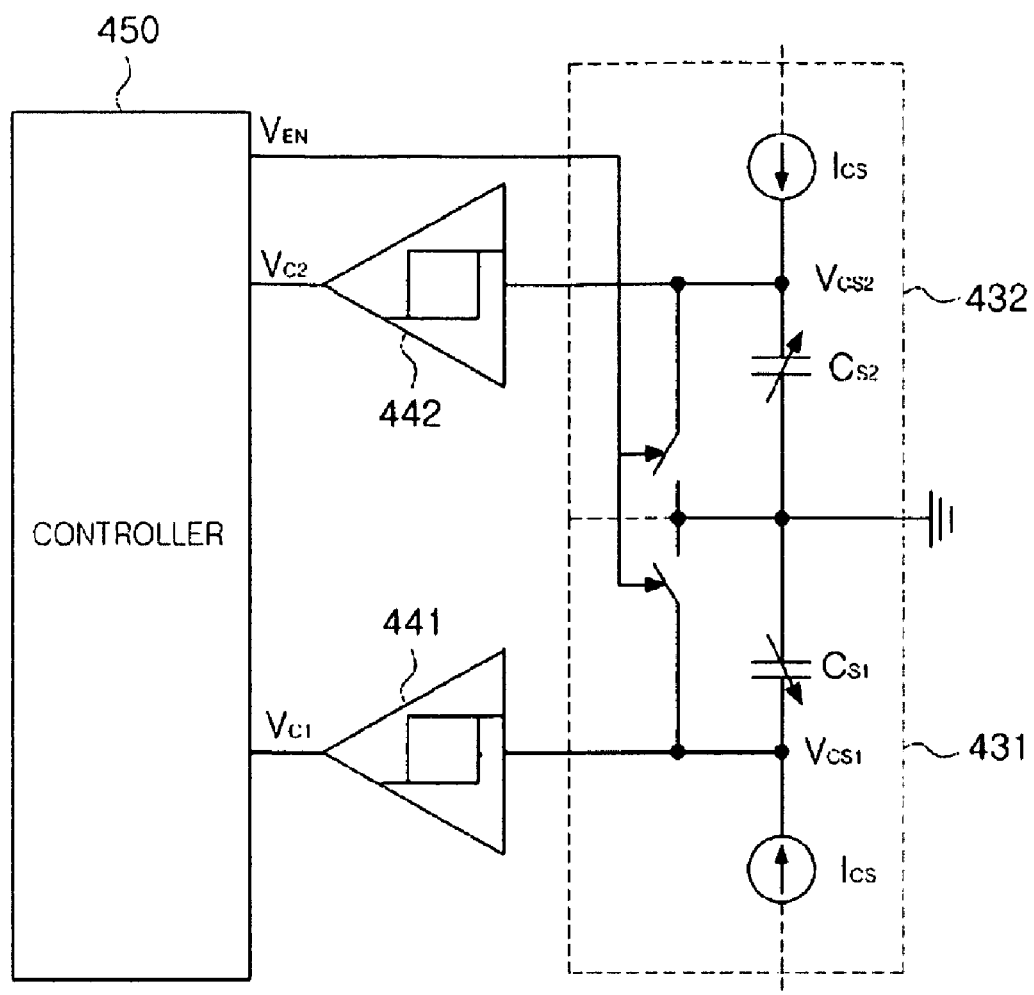

[Fig. 23]
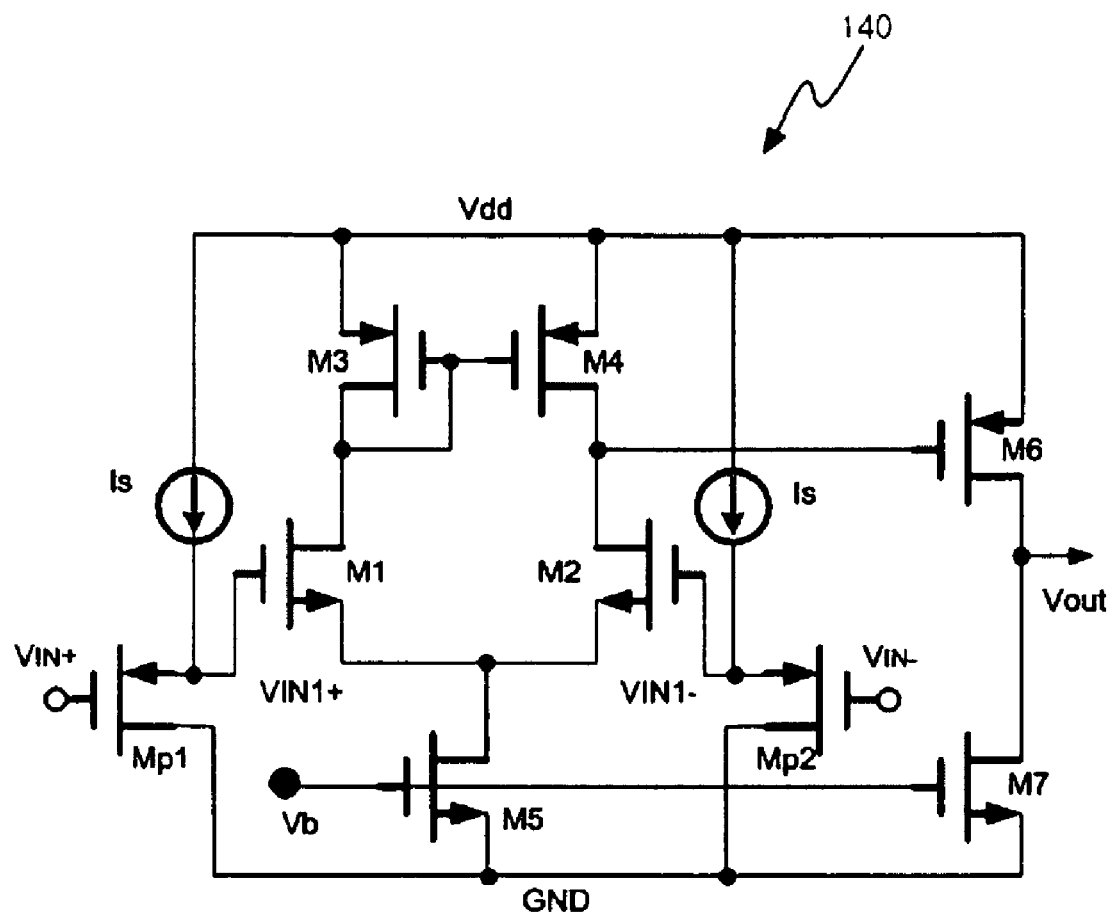

[Fig. 24]
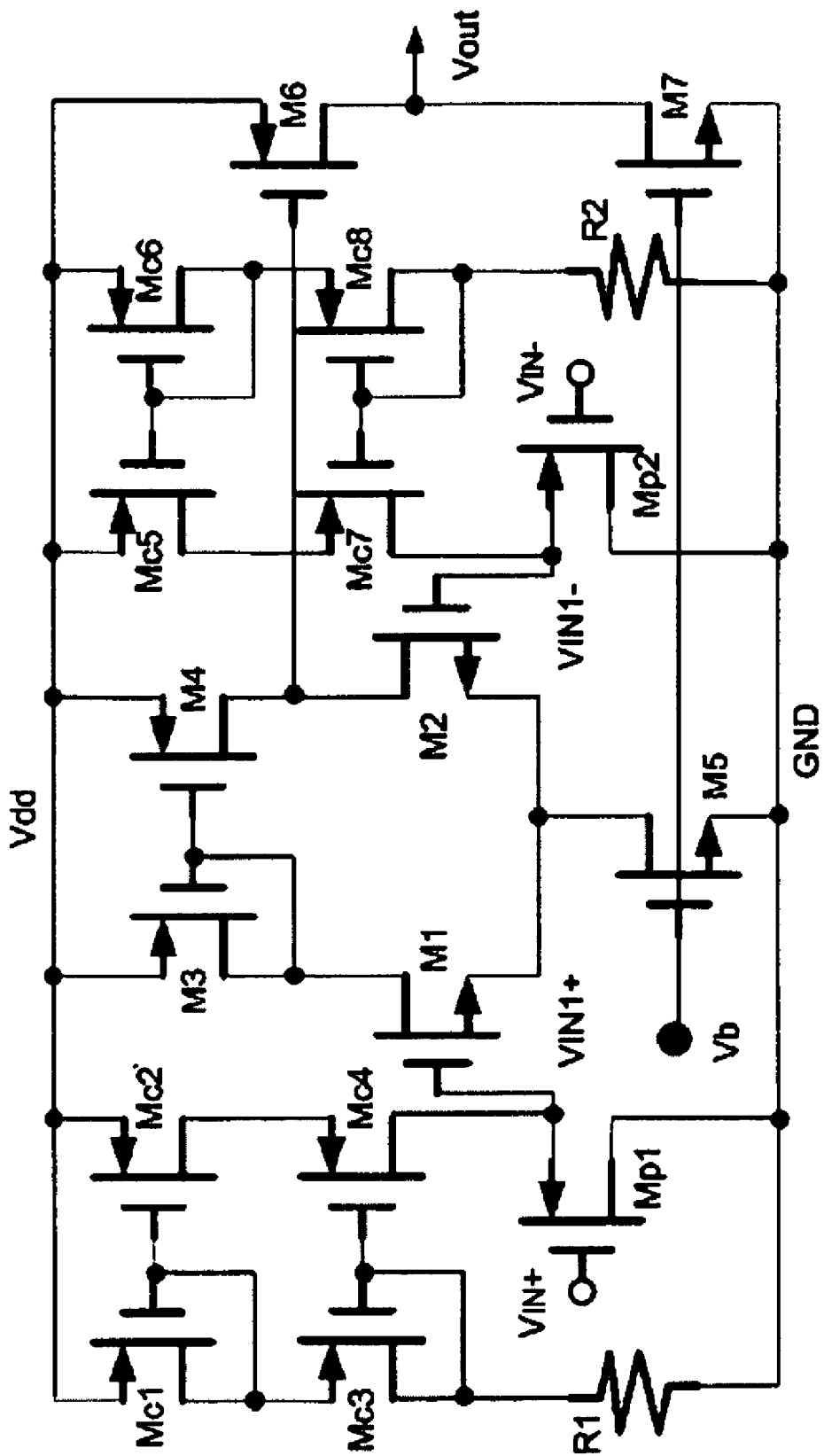

[Fig. 25]
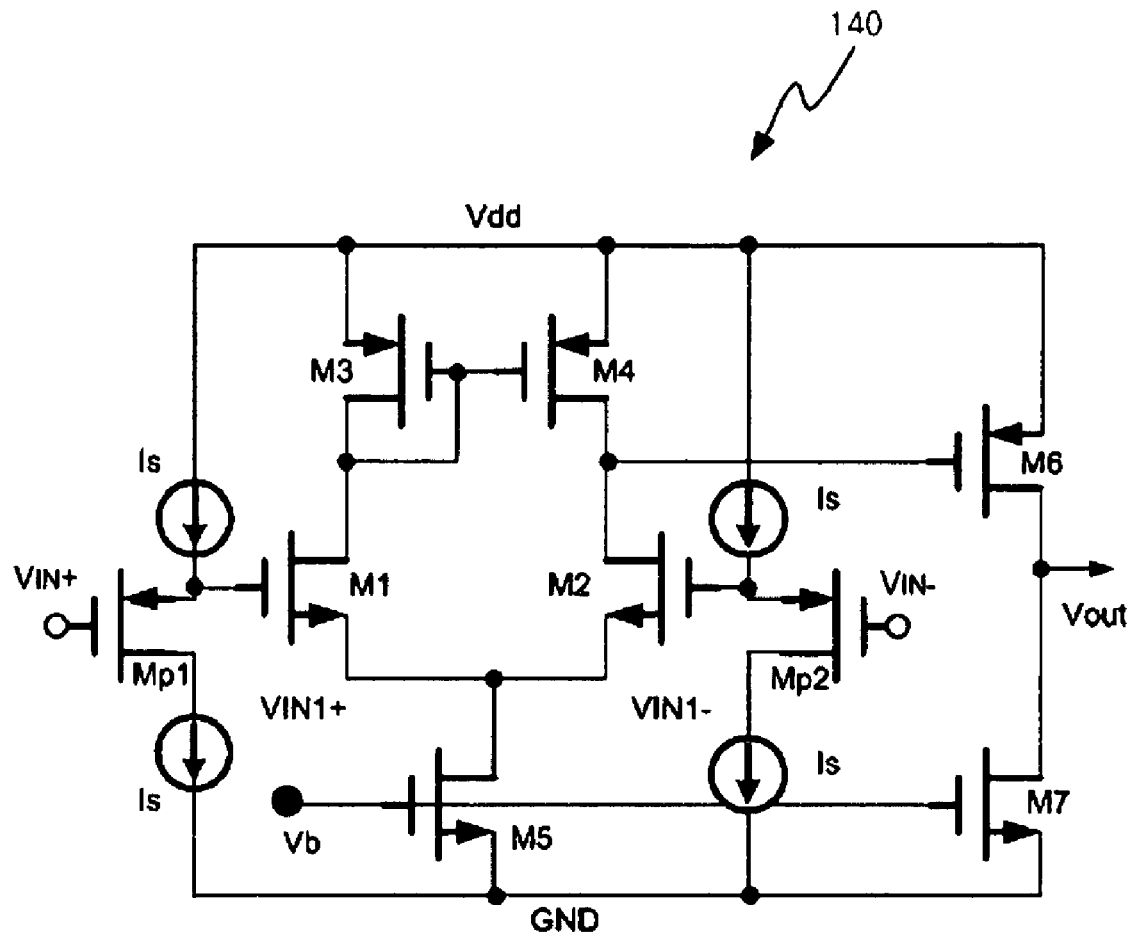

[Fig. 26]
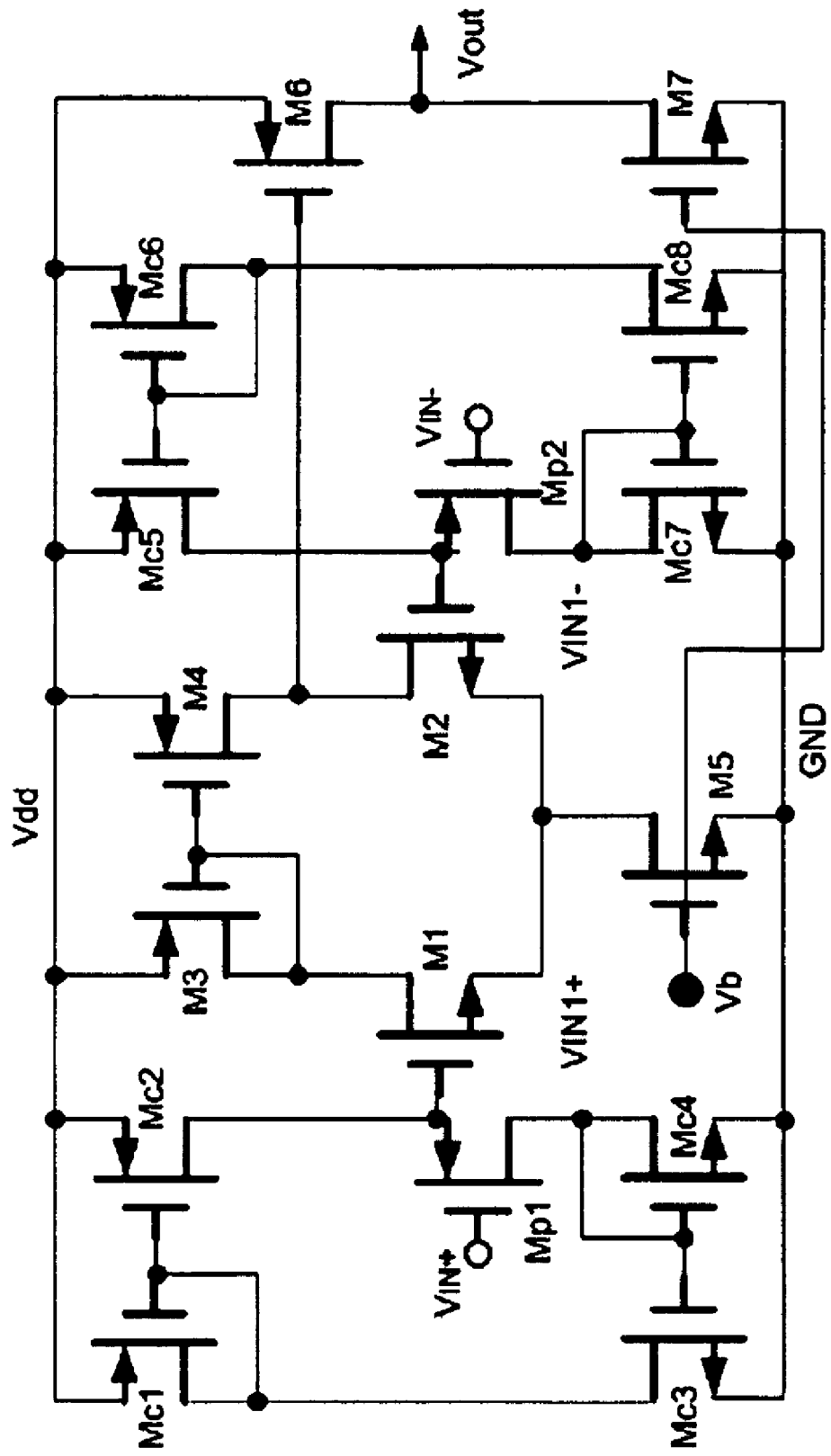

[Fig. 27]
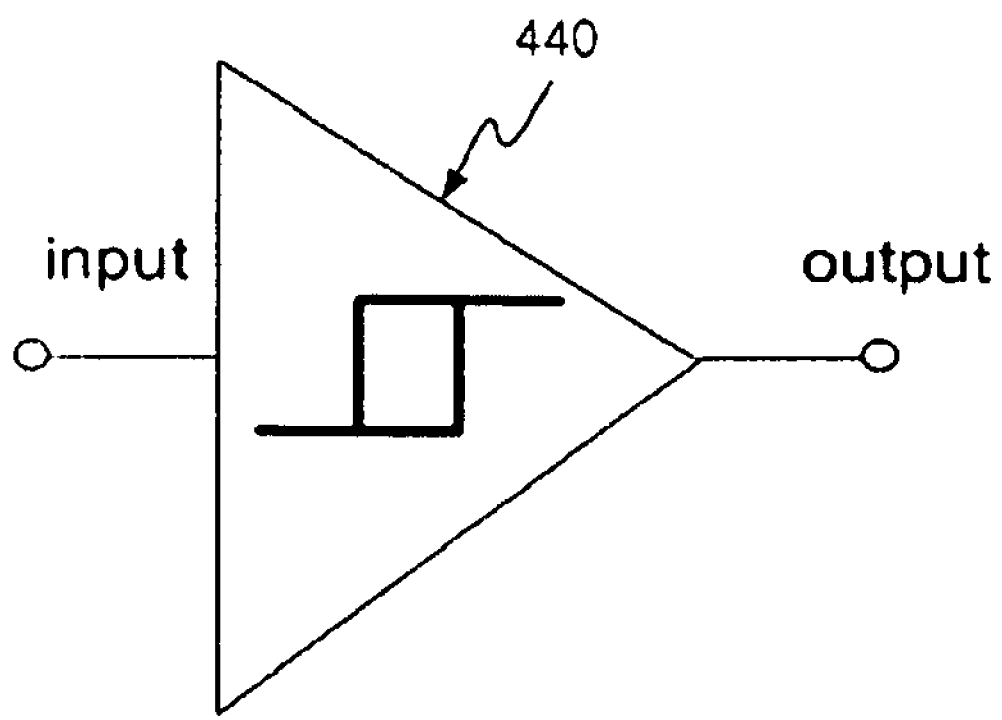

[Fig. 28]
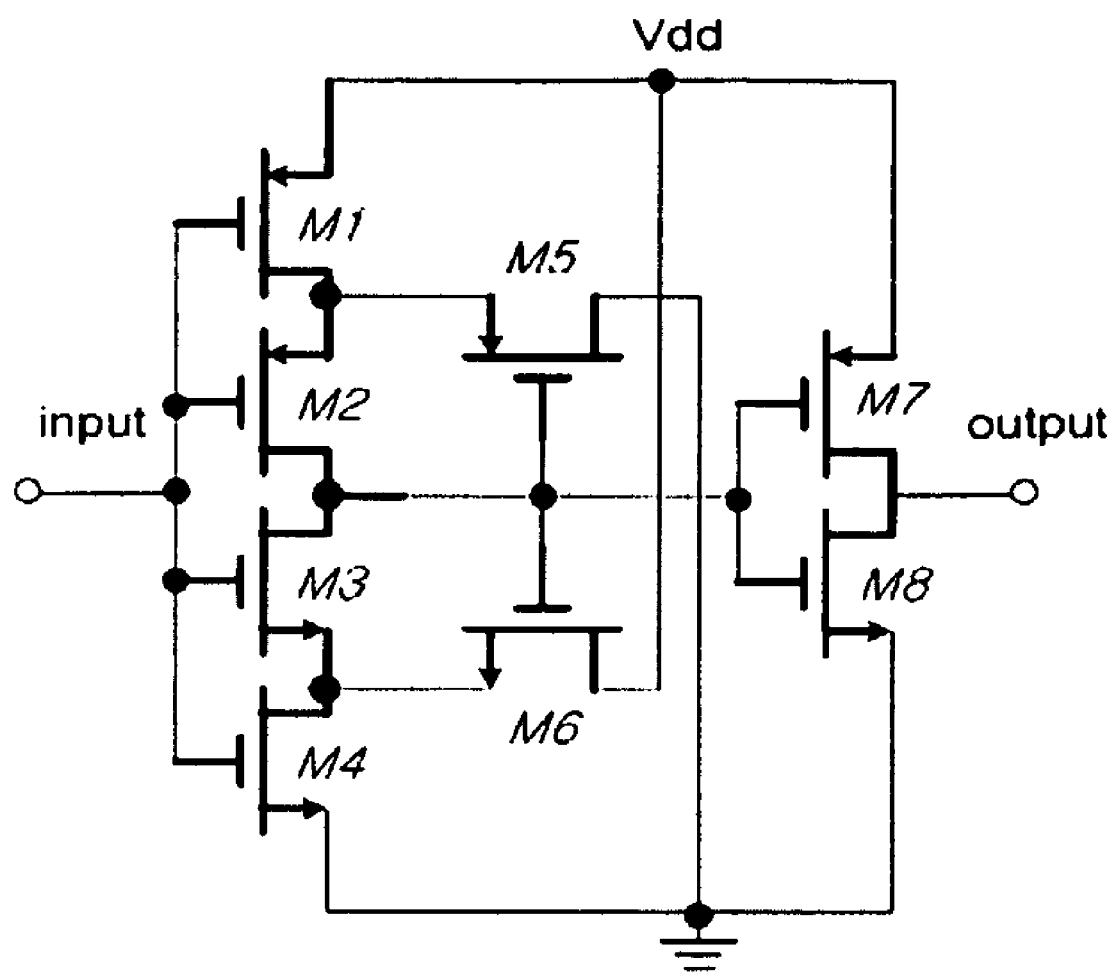

[Fig. 29]
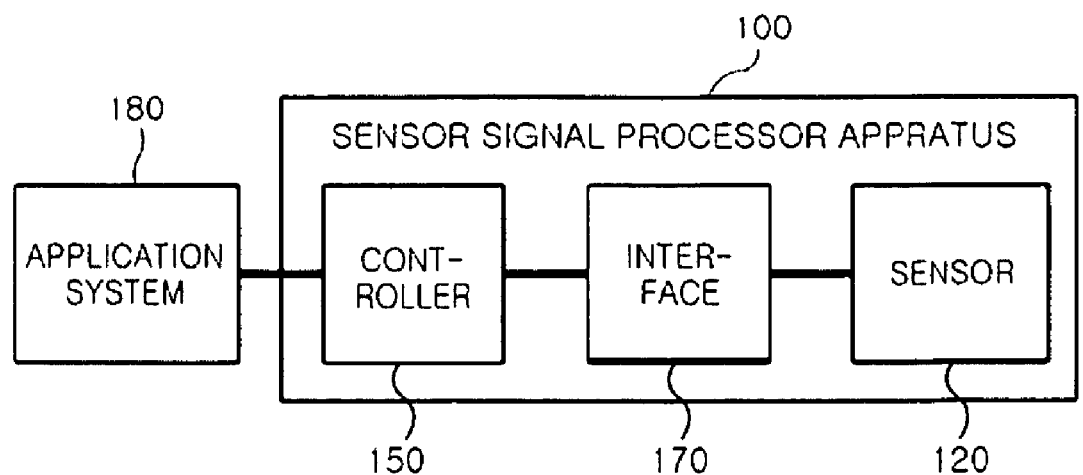

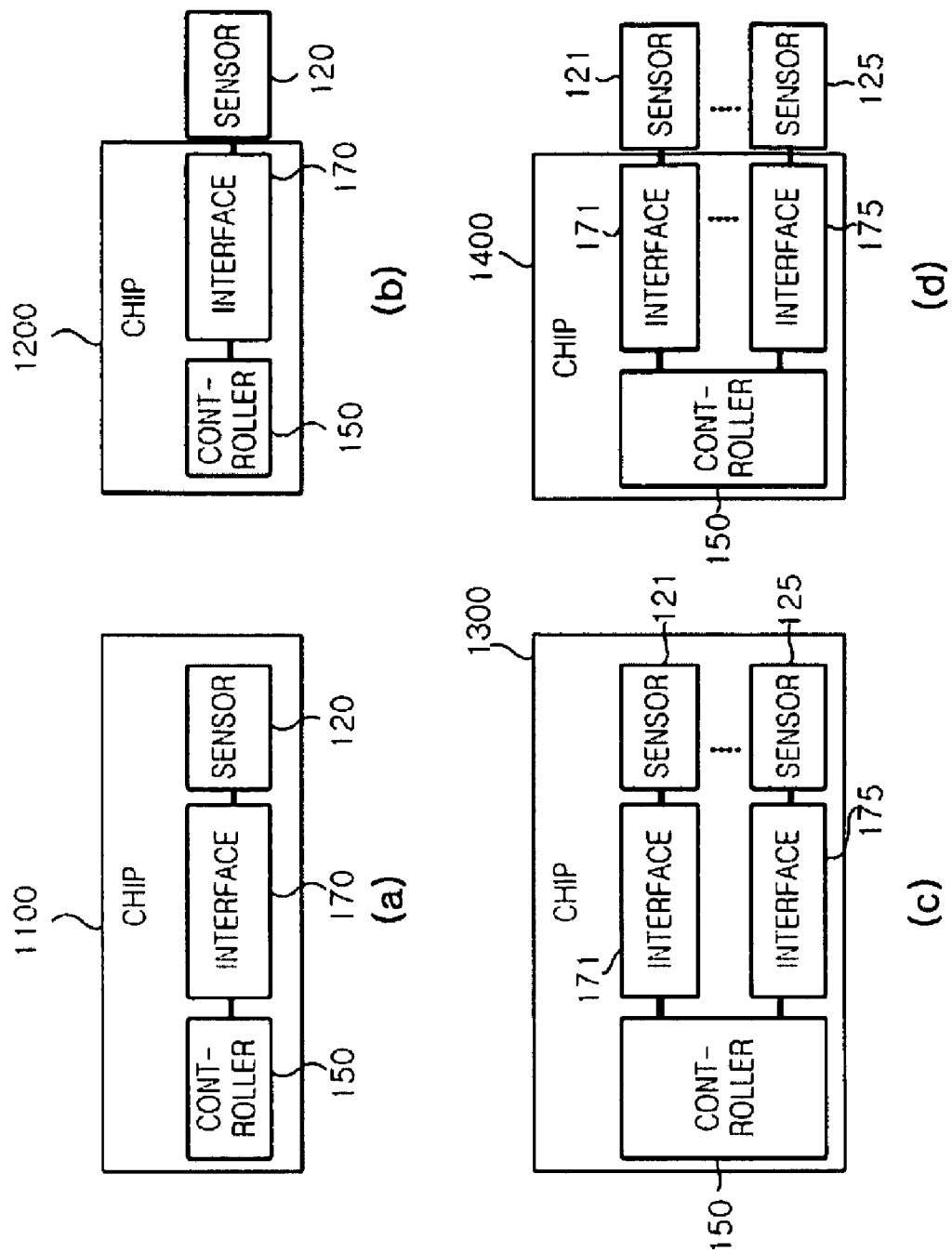
[Fig. 30]

[Fig. 31]
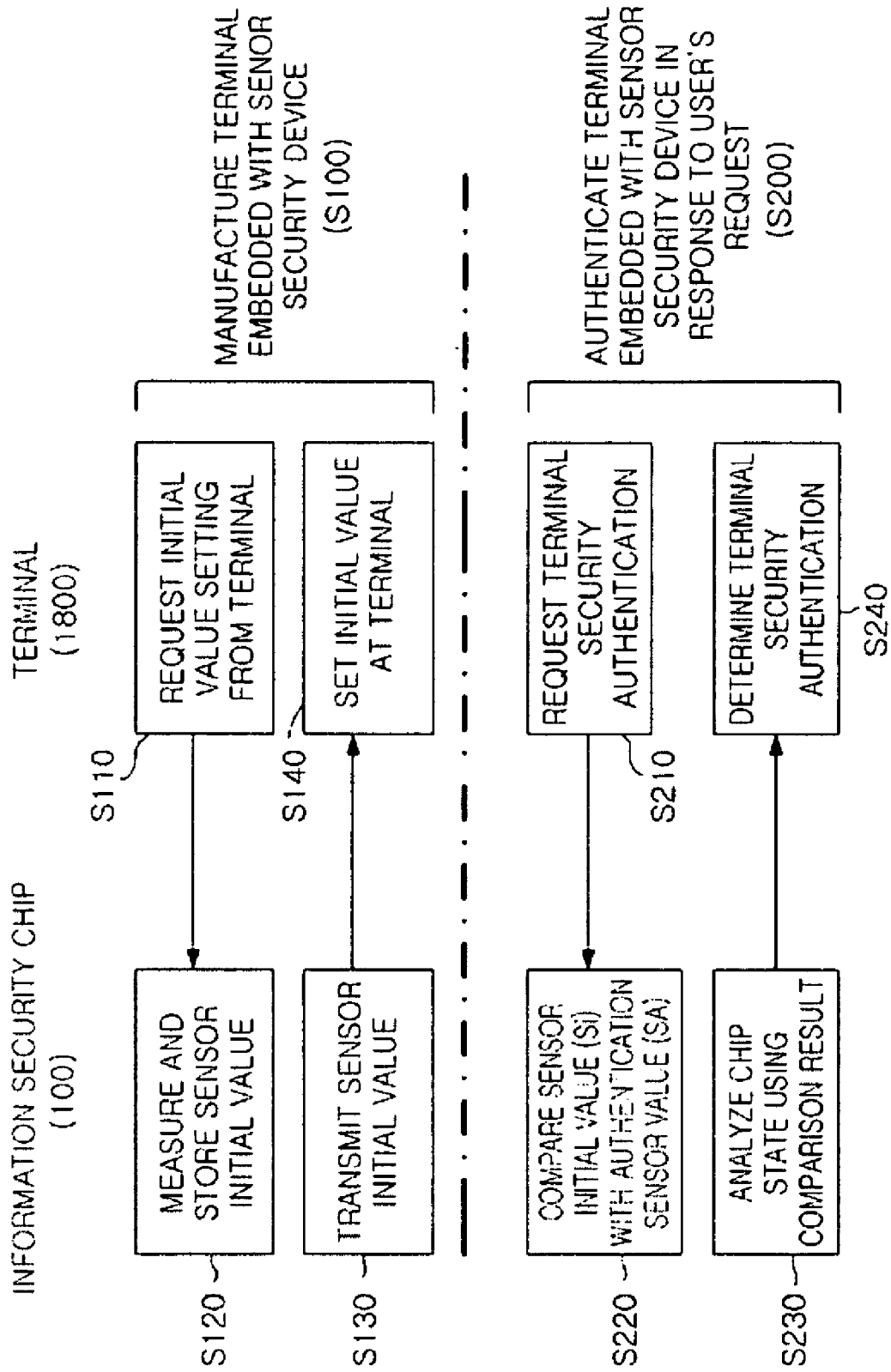

[Fig. 32]
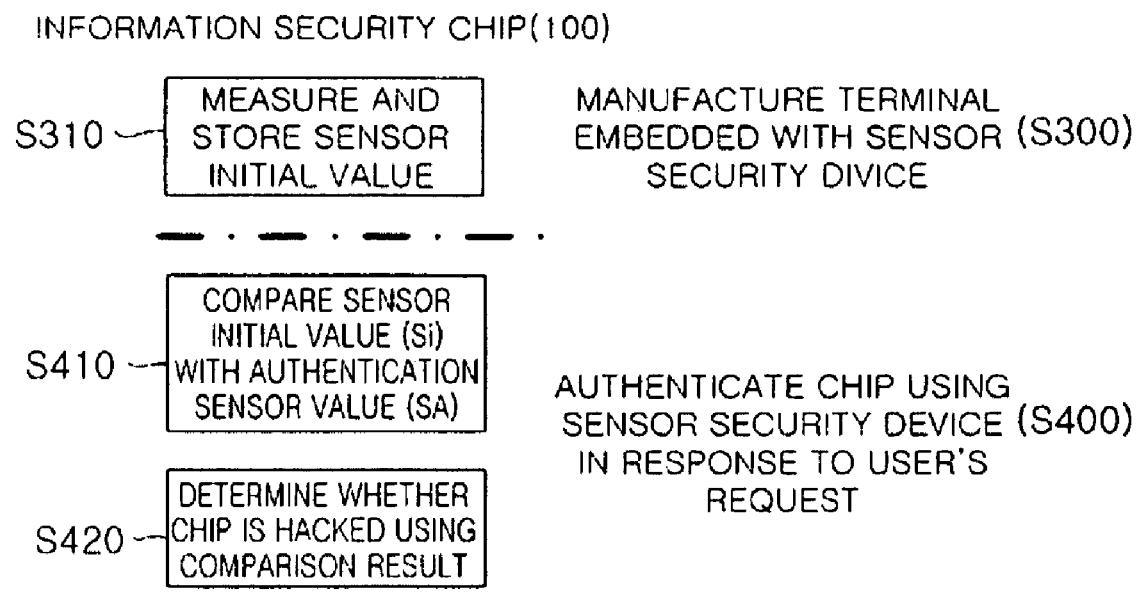

SENSOR SIGNAL PROCESSOR APPARATUS

TECHNICAL FIELD

The present disclosure relates to a sensor signal processor apparatus, and more particularly to, a sensor signal processor apparatus providing an easy and simple interface for various sensors and having good performance.

This work was supported by the IT R&D program of MIC/IITA [2006-S-041-01, Development of a common security core module for supporting secure and trusted service in the next generation mobile terminals]

BACKGROUND ART

Recently, methods of collecting information about variations of environmental conditions and operating a system according to the collected information are increasingly required. For this, various sensors are used to measure variations of environmental conditions, and sensor signal processor apparatuses are used to provide interfaces between the sensors and application systems for using measured values of the sensors in the application systems.

For example, values measured by various sensors such as a temperature sensor, a humidity sensor, and a velocity sensor are processed by a sensor signal processor apparatus, such that such sensors can be used as a thermometer, a hygrometer, and a velocity meter.

However, conventional sensor signal processor apparatuses have a complex circuit structure and poor performance.

DISCLOSURE OF INVENTION

Technical Problem

An aspect of the present invention provides a sensor signal processor apparatus providing an easy and simple interface for various sensors.

An aspect of the present invention also provides a sensor signal processor apparatus that can process measured values of a sensor more rapidly and efficiently.

An aspect of the present invention also provides a sensor signal processor apparatus can be applied to various application modules in connection with various sensors.

Technical Solution

According to an aspect of the present invention, there is provided a sensor signal processor apparatus including: a current source generating a constant current according to a preset value; a sensor outputting a sensor voltage using the current from the current source; a ramp integrator generating and outputting an integral voltage according to an input command; a comparator comparing the sensor voltage output from the sensor with the integral voltage output from the ramp integrator and outputting a result of the comparison; and a controller controlling the generating and outputting of the integral voltage of the ramp integrator according to the comparison result of the comparator.

According to another aspect of the present invention, there is provided a sensor signal processor apparatus including: a sensor including a sensor resistor; a ramp integrator including a current source generating a constant current according to a resistance of the sensor resistor, the ramp integrator generating and outputting an integral voltage based on the current generated by the current source in response to an input command; a digital comparator performing an comparison operation on the integral voltage output from the ramp integrator and outputting a result of the comparison; and a controller controlling the generating and outputting of the integral voltage of the ramp integrator according to the comparison result of the digital comparator.

According to another aspect of the present invention, there is provided a sensor signal processor apparatus including: a ramp integrator generating and outputting an integral voltage for a sensor; a plurality of comparators comparing the integral voltage of the ramp integrator with arbitrary input voltages; and a controller controlling the generating and outputting of the integral voltage of the ramp integrator according to outputs of the comparators.

According to another aspect of the present invention, there is provided a sensor signal processor apparatus including: a ramp integrator including a current source generating a constant current, a capacitive sensor receiving the current generated from the current source for charging, and a switch used to charge and discharge the capacitive sensor; a digital comparator performing an comparison operation on an integral voltage output from the ramp integrator and outputting a result of the comparison; and a controller controlling generating and outputting of the integral voltage of the ramp integrator according to the comparison result of the digital comparator.

Advantageous Effects

According to the present invention, the interface circuit of the sensor signal processor apparatus can be used for various sensors. Furthermore, the interface circuit of the sensor signal processor apparatus is simple and has good characteristics. In addition, the interface circuit of the sensor signal processor apparatus can be used for various sensors such a capacitive sensor and a resistance sensor without modification or with less modification.

Moreover, the sensor signal processor apparatus of the present invention can be easily adapted for a measuring system and an information security system. Furthermore, the sensor signal processor apparatus has good performance and suitable for being manufactured in the form of a semiconductor chip.

BRIEF DESCRIPTION OF THE DRAWINGS

FIG. 1 is a block diagram illustrating a sensor signal processor apparatus according to a first embodiment of the present invention.

FIG. 2 is a block diagram illustrating a modification version of the sensor signal processor apparatus of FIG. 1 having a multiple structure.

FIGS. 3 and 4 are circuit diagrams illustrating exemplary circuit structures of the sensor signal processor apparatuses of FIGS. 1 and 2, respectively.

FIG. 5 illustrates an exemplary structure of a controller of FIG. 4.

FIG. 6 illustrates wave forms of signals that are output from elements of the sensor signal processor apparatus of FIG. 4 according to Equations.

FIG. 7 is a block diagram illustrating a sensor signal processor apparatus for processing a signal of a resistance sensor according to a second embodiment of the present invention.

FIG. 8 is a block diagram illustrating a modification version of the sensor signal processor apparatus of FIG. 7 having a multiple structure.

FIG. 9 is a circuit diagram illustrating an exemplary circuit structure of the sensor signal processor apparatus of FIG. 7.

FIG. 10 is circuit diagram illustrating an exemplary circuit structure of a sensor signal processor apparatus having two interfaces as compared with the circuit structure having an interface.

FIG. 11 illustrates an exemplary structure of controller of FIG. 10.

FIG. 12 illustrates wave forms of signals output from elements of the sensor signal processor apparatus of FIG. 10.

FIG. 13 is a block diagram illustrating a sensor signal processor apparatus for a capacitive sensor according to a third embodiment of the present invention.

FIG. 14 is a block diagram illustrating a modification version of the sensor signal processor apparatus of FIG. 13 having a multiple structure.

FIG. 15 is a circuit diagram illustrating an exemplary circuit structure of the sensor signal processor apparatus of FIG. 13.

FIG. 16 is circuit diagram illustrating an exemplary circuit structure of a sensor signal processor apparatus having two interfaces as compared with the circuit structure of FIG. 15 having an interface.

FIG. 17 illustrates an exemplary circuit of the sensor signal processor apparatus of FIG. 7B for generating an internal voltage.

FIG. 18 illustrates wave forms of signals that are output from elements of the sensor signal processor apparatus of FIG. 16.

FIG. 19 is a block diagram illustrating a sensor signal processor apparatus for a capacitive sensor according to a fourth embodiment of the present invention.

FIG. 20 is a block diagram illustrating a modification version of the sensor signal processor apparatus of FIG. 19 having a multiple structure.

FIG. 21 is a circuit diagram illustrating an exemplary circuit structure of the sensor signal processor apparatus of FIG. 19.

FIG. 22 is circuit diagram illustrating an exemplary circuit structure for a sensor signal processor apparatus having two interfaces as compared with the circuit structure of FIG. 21 having an interface.

FIG. 23 illustrates a single supply power comparator of a sensor signal processor apparatus according to an embodiment of the present invention.

FIG. 24 illustrates an application example of the comparator of FIG. 23 using a single supply power source having two current sources.

FIG. 25 illustrates an exemplary circuit structure of a comparator using a single supply power source having four current sources.

FIG. 26 illustrates an application example of the comparator of FIG. 25.

FIGS. 27 and 28 illustrate an exemplary structure of a digital comparator according to an embodiment of the present invention.

FIG. 29 illustrates an application system and a sensor signal processor apparatus that are connected to each other according to an embodiment of the present invention.

FIG. 30 illustrates application examples of sensor signal processor apparatuses to various chips according to embodiments of the present invention.

FIG. 31 illustrates a relationship between a terminal and an information security chip including a sensor signal processor apparatus according to an embodiment of the present invention.

FIG. 32 is a view for explaining a method of authenticating an information security chip without association with a terminal according to an embodiment of the present invention.

BEST MODE FOR CARRYING OUT THE INVENTION

Exemplary embodiments of the present invention will now be described in detail with reference to the accompanying drawings. In every possible case, like reference numerals are used for referring to the same or similar elements in the description and drawings. In the following description, well-known functions or constructions are not described in detail since they would obscure the invention in unnecessary detail.

The present invention provides a sensor signal processor apparatus providing an easy and simple interface for various sensors. The interface circuit of the sensor signal processor apparatus can be used for various sensors such a capacitive sensor and a resistance sensor without modification or with less modification. The sensor signal processor apparatus can be used in various application fields in association with a control unit. For example, the sensor signal processor apparatus of the present invention can be used in an information security chip for the purpose of physical security by preventing hacking. That is, the sensor signal processor apparatus can be used in an information security chip to process a sensor signal for determining whether the information security chip is physically hacked and controlling the operation of the information security chip when it is determined that the chip is hacked.

FIG. 1 is a block diagram illustrating a sensor signal processor apparatus according to a first embodiment of the present invention.

Referring to FIG. 1, the sensor signal processor apparatus includes a current source 110, a resistance sensor 120, a ramp integrator 130, a comparator 140, and a controller 150.

The current source 110 generates and outputs a current according to a preset value. The resistance sensor 120 produces a sensor voltage $V_{RS1}$ using the current generated by the current source 110. The ramp integrator 130 generates an integral voltage $V_{SC}$ according to the control of the controller 150. Here, the ramp integrator 130 has time-continuity characteristics.

The comparator 140 compares the sensor voltage $V_{RS1}$ of the resistance sensor 120 with the integral voltage $V_{SC}$ generated by the ramp integrator 130 and outputs a resulting voltage $V_{C1}$.

The controller 150 outputs a control voltage $V_{EN}$ using the resulting voltage $V_{C1}$ to control the integral voltage $V_{SC}$ of the ramp integrator 130. The controller 150 can be configured in various manners according to application systems. For example, the controller 150 can be configured with an N-bit counter and a clock. Alternatively, the controller 150 can be configured with a plurality of gate logics.

According to the embodiment of FIG. 1, the circuitry of the sensor signal processor apparatus including the resistance sensor 120 can be easily and simply constructed, and variations of properties such as velocity, temperature, pressure, and humidity can be measured by the resistance sensor 120 in the form of resistance.

The sensor signal processor apparatus can be used in various application fields for various devices such as a display, a thermometer, a hygrometer, a thermohygrost at (a temperature and humidity regulator), a velocity meter, and a chip protection device by processing values measured by the resistance sensor 120 using the controller 150. The application fields of the sensor signal processor apparatus can be classified into measuring systems and information security systems.

FIG. 2 is a block diagram illustrating a modification version of the sensor signal processor apparatus of FIG. 1 having a multiple structure.

Referring to FIG. 2, the sensor signal processor apparatus includes a plurality of current sources 111 through 115, a plurality of resistance sensors 121 through 125, a ramp integrator 130, a plurality of comparators 141 to 145, and a controller 150.

The sensor signal processor apparatus of FIG. 2 operates in the same way as the sensor signal processor apparatus of FIG. 1. Since the sensor signal processor apparatus of FIG. 2 includes the plurality of resistance sensors 121 through 125, properties of different or same kind can be simultaneously measured by a system using the sensor signal processor apparatus. For example, the resistance sensor 121 can be used as a temperature sensor, and the resistance sensor 122 can be used as a humidity sensor. In this way, the resistance sensors 121 to 125 can be used, and thus variations of environmental conditions can be simultaneously measured using the resistance sensors 121 to 125. Values measured using the resistance sensors 121 to 125 are processed by the controller 150.

FIGS. 3 and 4 are circuit diagrams illustrating exemplary circuit structures of the sensor signal processor apparatuses of FIGS. 1 and 2, respectively.

The circuit structure of FIG. 3 for the sensor signal processor apparatus of FIG. 1 includes a current source ($I_{RS}$) 110, a resistance sensor ($R_{S1}$) 120, a ramp integrator 130, a comparator 140, and a controller 150. The current source 110 generates a predetermined current $I_{RS}$. The resistance sensor 120 receives the current $I_{RS}$ from the current source 110. The ramp integrator 130 has time-continuity characteristics. The comparator 140 compares a sensor voltage $V_{RS1}$ of the resistance sensor 120 with an integral voltage $V_{SC}$ generated by the ramp integrator 130. The controller 150 outputs a control voltage $V_{EN}$ using an output voltage $V_{C1}$ of the comparator 140 for on-off controlling the ramp integrator 130.

In the current embodiment, the ramp integrator 130 includes a current source ($I_{RC}$), a capacitor ($C_R$), and a switch $S_R$ connected to the capacitor in parallel. In the circuit structure of FIG. 3, two voltages $V_{RS1}$ and $V_{SC}$ input to the comparator 140 can be expressed by Equation 1 below.

$$V_{RS1} = I_{RS}R_{S1}, \quad V_{SC} = \frac{I_{RC}}{C_R}T_{C1} \quad \text{[Equation 1]}$$

The comparator 140 compares the sensor voltage $V_{RS1}$ and the integral voltage $V_{SC}$ and outputs a resulting voltage $V_{C1}$, and when the two voltages $V_{RS1}$ and $V_{SC}$ are of the same level, the level of the resulting voltage V changes (refer to FIG. 6). That is, the level of the resulting voltage V of the comparator 140 changes from 1 to 0 (refer to FIG. 6). In the current embodiment, the level of the resulting voltage $V_{C1}$ of the comparator 140 changes at a time T. Referring to FIG. 6, the level of the integral voltage $V_{SC}$ increases with time from zero level (when time=0) to a high level. This can be expressed by Equation 2 below.

$$T_{C1} = \frac{V_{RS1}}{I_{RS}}C_R = \frac{I_{RS}}{I_{RC}}R_{S1}C_R \quad \text{[Equation 2]}$$

The sensor voltage $V_{RS1}$ of the resistance sensor 120 can be measured by counting the number of pulses of a clock signal of the controller 150 for the time $T_{C1}$. When the clock signal has a higher frequency, the sensor voltage $V_{RS1}$ of the resistance sensor 120 can be measured more precisely.

In Equation 2, $T_{C1}$ can be adjusted by varying $I_{RS}/I_{RC}$, and $I_{RS}$ and $I_{RC}$ have the same characteristics. The current source 110 may include a semiconductor device such as a metal-oxide-semiconductor (MOS) transistor and a bipolar transistor.

FIG. 4 is circuit diagram illustrating an exemplary circuit structure of the sensor signal processor apparatus of FIG. 2. The circuit structure of FIG. 4 provides two interfaces as compared with the circuit structure of FIG. 3 providing an interface.

The sensor signal processor apparatus of FIG. 4 provides the same functions as the sensor signal processor apparatus of FIG. 1. The circuit structure of the sensor signal processor apparatus of FIG. 4 includes a first current source ($I_{RS}$) 111, a second current source ($I_{RS}$) 112, a first resistance sensor ($R_{S1}$) 121, a second resistance sensor ($R_{S2}$) 122, a ramp integrator 130, a first comparator 141, a second comparator 142, and a controller 150.

In the current embodiment, more precise measuring circuit can be constructed depending on the configuration of the controller 150. FIG. 5 illustrates an exemplary structure of the controller 150. The controller 150 of FIG. 5 can include a NAND gate 152 and an EX-OR gate 154. A mathematical model expressed by Equation 3 below can be obtained from the circuit structure of FIG. 4. Furthermore, times $T_{C1}$ and $T_{C2}$ where output voltages of the first and second comparators 140 change can be expressed by Equation 3 below.

$$\text{When } V_{RS1} = I_{RS}R_{S1} = V_{SC}, T_{C1} = \frac{V_{RS1}}{I_{RC}}C_R \quad \text{[Equation 3]}$$

$$\text{When } V_{RS2} = I_{RS}R_{S2} = V_{SC}, T_{C2} = \frac{V_{RS2}}{I_{RC}}C_R$$

In the current embodiment, output values of the first and second resistance sensors 121 and 122 can be measured by counting the number of pulses of a clock signal of the controller 150 for times $T_{C1}$ and $T_{C2}$. The controller 150 can be properly configured for an application system by using the respective times $T_{C1}$ and $T_{C2}$ of Equation 3. Alternatively, the controller 150 can be configured using a different $\Delta T$ between the times $T_{C1}$ and $T_{C2}$ as shown in Equation 4 in order for precise measurement with less influence by external environment.

$$\Delta T = T_{C2} - T_{C1} \quad \text{[Equation 4]}$$
$$= \frac{(V_{RS2} - V_{RS1})}{I_{RC}}C_R$$
$$= \frac{I_{RS}}{I_{RC}}(R_{S2} - R_{S1})C_R$$

In the current embodiment, the output values of the first and second resistance sensors 121 and 122 can be measured by counting the number of pulses of a clock signal of the controller 150 for time $\Delta T$. Furthermore, as shown in Equation 4, time $\Delta T$ can be adjusted by varying $I_{RS}/I_{RC}$, and environmental factors decreasing the performance of the sensor signal processor apparatus due to a sensor resistance difference can be removed. FIG. 6 illustrates wave forms of signals that are output from the elements of the sensor signal processor apparatus of FIG. 4 according to above-described Equations. In FIG. 6, "switch on" and "switch off" denote turning on and off of the switch $S_R$ of the ramp integrator 130 in response to the control signal $V_{EN}$ of the controller 150.

FIG. 7 is a block diagram illustrating a sensor signal processor apparatus for processing a signal of a resistance sensor according to a second embodiment of the present invention.

Referring to FIG. 7, the sensor signal processor apparatus includes a resistance sensor 220, a ramp integrator 230 including a current source generating a constant current according to a sensor resistance of the resistance sensor 220, a digital comparator 240 comparing a voltage $V_{CS1}$ from the ramp integrator 230 with a reference voltage, and a controller 250 receives an output signal $V_{C1}$ of the digital comparator 240 to generate a control signal $V_{EN}$ for controlling the ramp integrator 230. The digital comparator 240 includes a digital Schmitt trigger.

FIG. 8 is a block diagram illustrating a modification version of the sensor signal processor apparatus of FIG. 7 having a multiple structure.

Referring to FIG. 8, the sensor signal processor apparatus includes a plurality of resistance sensors 221 through 225, a plurality of ramp integrators 231 through 235 each having a current source, a plurality of digital comparators 241 through 245, and a controller 250.

The sensor signal processor apparatus of FIG. 8 operates in the same way as the sensor signal processor apparatus of FIG. 7. Since the sensor signal processor apparatus of FIG. 8 includes the plurality of resistance sensors 221 through 225, different properties can be simultaneously measured by a system using the sensor signal processor apparatus.

FIG. 9 is a circuit diagram illustrating an exemplary circuit structure of the sensor signal processor apparatus of FIG. 7.

The circuit structure of FIG. 9 for the sensor signal processor apparatus is configured using a ramp integrator 230 and a digital Schmitt trigger as a digital comparator 240 to provide interfacing.

The sensor signal processor apparatus includes a resistance sensor 220, a ramp integrator 230 having a current sensor, a digital comparator 240 comparing a voltage $V_{SC}$ of the ramp integrator 230 with a predetermined reference voltage, and a controller 250.

The ramp integrator 230 includes a current source ($I_{RS1}$) generating a predetermined current according to the resistance $R_{S1}$ of the resistance sensor 220, a capacitor ($C_R$) receiving the current $I_{RC1}$ of the current source $I_{RS1}$ of the ramp integrator 230, and a switch $S_R$ for charging and discharging the capacitor ($C_R$).

The characteristics of the sensor signal processor apparatus of FIG. 9 can be expressed by Equation 5 below similar to Equation 1 for the sensor signal processor apparatus of FIG. 3

$$V_{SC1} = \frac{I_{RS1}}{C_R} T_{C1} \qquad \text{[Equation 5]}$$

The digital comparator 240 receives only one input voltage. The digital comparator 240 has high and low threshold voltages $V_{thH}$ and $V_{thL}$. The digital comparator 240 compares the voltage $V_{SC}$ of the ramp integrator 230 with the high threshold voltage $V_{thH}$. When the two voltages $V_{SC}$ and $V_{thH}$ are of the same, an output voltage $V_{C1}$ of the digital comparator 240 changes.

That is, the output voltage $V_{C1}$ of the digital comparator 240 changes from 0 to 1 as shown in FIG. 12. The output voltage $V_{C1}$ of the comparator 240 changes at a time $T_{C1}$. The voltage $V_{SC}$ increases with time from zero level (when time=0) to a high level. This can be expressed by Equation 6 below.

$$T_{C1} = \frac{V_{thH}}{I_{RS1}} C_R, \quad V_{CS1} = V_{thH} \qquad \text{[Equation 6]}$$

An output value of the resistance sensor 220 can be detected by counting the number of pulses of a clock signal of the controller 250 for the time $T_{C1}$. When the clock signal has a higher frequency, output values of the resistance sensor 220 can be measured more precisely. Furthermore, since the sensor signal processor apparatus of FIG. 9 includes the digital comparator 240, an additional comparison voltage source (refer to $V_{RS1}$ of FIG. 1) is not necessary.

FIG. 10 is circuit diagram illustrating an exemplary circuit structure of the sensor signal processor apparatus of FIG. 8. The circuit structure of FIG. 10 provides two interfaces as compared with the circuit structure of FIG. 9 providing an interface.

Referring to FIG. 10, the circuit structure of the sensor signal processor apparatus includes two resistance sensors 221 and 222, two ramp integrators 231 and 232 each having a current source, two digital comparator 242 and 242, and a controller 250.

FIG. 11 illustrates an exemplary structure of the controller 250.

Referring to FIG. 11, the controller 250 can include an AND gate 252 and an EX-OR gate 254. A mathematical model expressed by Equation 7 below can be obtained from the circuit structure of FIG. 10. Times $T_{C1}$ and $T_{C2}$ where output voltages of digital comparators 241 and 242 change can be calculated using Equation 7.

$$\text{When } V_{thH} = V_{SC1}, \ T_{C1} = \frac{V_{SC1}}{I_{RS1}} C_R \qquad \text{[Equation 7]}$$
$$\text{When } V_{thH} = V_{SC2}, \ T_{C2} = \frac{V_{SC2}}{I_{RC2}} C_R$$

In the current embodiment, output values of the resistance sensors 221 and 222 can be measured by counting the number of pulses of a clock signal of the controller 250 for times $T_{C1}$ and $T_{C2}$, respectively. The controller 250 can be properly configured for an application system by using the respective times $T_{C1}$ and $T_{C2}$ of Equation 7. Alternatively, the controller 250 can be configured using a different $\Delta T$ between the times $T_{C1}$ and $T_{C2}$ as shown in Equation 8 in order for precise measurement with less influence by external environment.

$$\Delta T = T_{C2} - T_{C1} \qquad \text{[Equation 8]}$$
$$= \left(\frac{1}{I_{RS2}} - \frac{1}{I_{RS1}}\right) C_R V_{thH}$$
$$= \left(\frac{1}{aR_{S2}} - \frac{1}{aR_{S1}}\right) C_R V_{thH}$$

where is a nonlinear environment coefficient (e.g., a nonlinear temperature coefficient).

In the current embodiment, the output values of the resistance sensors 221 and 222 can be measured by counting the number of pulses of a clock signal of the controller 250 for $\Delta T$. Environmental factors decreasing the performance of the sensor signal processor apparatus due to a sensor resistance difference can be removed. FIG. 12 illustrates wave forms of signals output from the elements of the sensor signal processor apparatus of FIG. 10 according to the above-described mathematical models (Equations).

FIG. 13 is a block diagram illustrating a sensor signal processor apparatus for a capacitive sensor according to a third embodiment of the present invention.

Referring to FIG. 13, the sensor signal processor apparatus includes a ramp integrator 330, a comparator 340, and a controller 350.

The ramp integrator 330 includes a current source ($I_{CS}$) (refer to FIG. 15) generating a constant current, a capacitor ($C_{S1}$) (refer to FIG. 15) receiving the current $I_{CS}$ of the current source, and a switch $S_R$ for charging and discharging the capacitor ($C_{SS}$).

The comparator 340 compares two voltages. For example, the comparator 340 compares a voltage generated by the ramp integrator 330 with an external voltage or an internal voltage.

The controller 350 can be configured in various manners. For example, the controller 350 can be configured with an N-bit counter and a clock according to application systems. Alternatively, the controller 350 can be simply configured with several gate logics.

According to the current embodiment, when variations of sensing properties such as velocity, temperature, pressure, and humidity are measured using a capacitive sensor, the circuitry of the sensor signal processor apparatus can be easily and simply constructed for the capacitive sensor. Furthermore, the sensor signal processor apparatus in which values measured by a capacitive sensor are detected by the controller 350 can be used in various application fields for various devices such as a display, a thermometer, a hygrometer, a pressure gage, a thermohygrost at (a temperature and humidity regulator), a velocity meter, and a chip protection device. The application fields of the sensor signal processor apparatus can be broadly classified into measuring systems and information security systems.

FIG. 14 is a block diagram illustrating a modification version of the sensor signal processor apparatus of FIG. 13 having a multiple structure.

Referring to FIG. 14, the sensor signal processor apparatus includes a plurality of ramp integrators 331 through 335, a plurality of comparators 341 through 345, and a controller 350. The comparators 341 through 345 compare an internal or external voltage $V_{SR}$ with voltages $V_{CS1}$ through $V_{CSn}$ received from the ramp integrators 331 through 335.

Therefore, a system including the sensor signal processor apparatus can simultaneously measure various properties using various kinds of resistance sensors. For example, a system including the sensor signal processor apparatus can simultaneously measure properties such as temperature and humidity using resistance sensors such as a temperature sensor and a humidity sensor. Values measured in this way are processed by the controller 350.

FIG. 15 is a circuit diagram illustrating an exemplary circuit structure of the sensor signal processor apparatus of FIG. 13.

The circuit structure of FIG. 15 for the sensor signal processor apparatus includes a ramp integrator 330, a comparator 340, and a controller 350. The ramp integrator 330 includes a current source ($I_{CS}$) generating a constant current, a capacitor ($C_{S1}$) (a capacitive sensor) receiving the current $I_{CS}$ generated by the current source, and a switch $S_R$ for charging and discharging the capacitor ($C_{S1}$). The comparator 340 compares a voltage $V_{CS1}$ generated by the ramp integrator 330 with an external or internal voltage $V_{SR}$. The controller 350 receives an output signal of the comparator 340 and generates a control signal $V_{EN}$ for controlling the ramp integrator 330.

The current embodiment is characterized in that an interface for processing a sensor signal is constructed using the ramp integrator 330.

The sensor signal processor apparatus having above-described characteristics can be expressed by Equation 9 below.

$$V_{SC1} = \frac{I_{CS}}{C_{S1}} T_{C1} \quad \text{[Equation 9]}$$

If the ramp integrator 330 generates an internal voltage $V_{SR}$ using a current source and a resistor for improving circuit characteristics, the internal voltage $V_{SR}$ can be expressed by Equation 10 below.

$$V_{SR} = I_{SR} R_S \quad \text{[Equation 10]}$$

An exemplary circuit structure of the ramp integrator 330 for this case is illustrated in FIG. 17.

The comparator 340 compares the two voltages $V_{CS1}$ and $V_{SR}$, and the voltage level of an output signal of the comparator 140 changes when the two voltages $V_{CS1}$ and $V_{SR}$ are of the same level (refer to FIG. 18). Here, the voltage level of the output signal of the comparator 340 changes from 1 to 0. That is, the level of the voltage $V_{CS1}$ increases with time from zero level (when time=0) to a high level. This can be expressed by Equation 11 below.

$$T_{C1} = \frac{V_{SR}}{I_{CS}} C_{S1} = \frac{I_{SR}}{I_{CS}} R_s C_{S1} \quad \text{[Equation 11]}$$

Output values of a resistance sensor can be detected by counting the number of pulses of a clock signal of the controller 350 for the time $T_{C1}$. Referring to Equation 11, the time $T_{C1}$ can be adjusted by varying $I_{SR}/I_{CS}$, and $I_{RS}$ and $I_{RC}$ have the same characteristics. The current source ($I_{CS}$) may include a semiconductor device such as a MOS transistor and a bipolar transistor.

FIG. 16 is circuit diagram illustrating an exemplary circuit structure for the sensor signal processor apparatus of FIG. 14. The circuit structure of FIG. 16 provides two interfaces as compared with the circuit structure of FIG. 15 providing an interface.

Referring to FIG. 16, the sensor signal processor apparatus includes ramp integrators 331 and 332, comparators 341 and 342, and a controller 350 that have the same structures as those of the elements of the sensor signal processor apparatus of FIG. 15.

The operation of the sensor signal processor apparatus of FIG. 16 can be expressed by the same mathematical model as that for the operation of the sensor signal processor apparatus of FIG. 15. However, the sensor signal processor apparatus of FIG. 16 can be more precise according to the configuration of the controller 350. For this, the controller 350 can include a NAND gate and an EX-OR gate like the controller 150 of FIG. 5. In this case, a mathematical operation model of the sensor signal processor apparatus can be expressed with respect to times $T_{C1}$ and $T_{C2}$ where output voltages of the comparators 341 and 342 change, as shown by Equation 12 below.

$$T_{C1} = \frac{V_{CS1}}{I_{CS}}C_{S1}, T_{C2} = \frac{V_{CS2}}{I_{CS}}C_{S2} \quad \text{[Equation 12]}$$

Although the controller 350 can be configured for an application system by using the respective times $T_{C1}$ and $T_{C2}$ of Equation 12, the controller 350 is configured using a different ??T between the times $T_{C1}$ and $T_{C2}$ shown in Equation 13 in order for precise measurement with less influence by unstable external environment factors.

$$\Delta T = T_{C2} - T_{C1} \quad \text{[Equation 13]}$$
$$= \frac{V_{SR}}{I_{RC}}(C_{S2} - C_{S1})$$
$$= \frac{I_{SR}}{I_{CS}}(C_{S2} - C_{S1})R_S$$

In the current embodiment, output values of resistance sensors can be measured by counting the number of pulses of a clock signal of the controller 350 for time $\Delta T$. Furthermore, as shown in Equation 13, time $\Delta T$ can be adjusted by varying and environmental factors decreasing the performance of the sensor signal processor apparatus due to a sensor resistance difference can be removed. FIG. 18 illustrates wave forms of signals that are output from the elements of the sensor signal processor apparatus of FIG. 16 according to Equation 13.

FIG. 19 is a block diagram illustrating a sensor signal processor apparatus for a capacitive sensor according to a fourth embodiment of the present invention.

Referring to FIG. 19, the sensor signal processor apparatus includes a ramp integrator 430, a digital comparator 440, and a controller 450.

The ramp integrator 430 includes a current source generating a predetermined current, a capacitor receiving a current from the current source, and a switch for charging and discharging the capacitor.

The digital comparator 440 compares a voltage output from the ramp integrator 430 with a predetermined reference voltage. The digital comparator 440 includes a digital Schmitt trigger.

The controller 450 generates a control signal $V_{EN}$ according to an output signal of the digital comparator 440 to control the ramp integrator 430.

FIG. 20 is a block diagram illustrating a modification version of the sensor signal processor apparatus of FIG. 19 having a multiple structure.

The sensor signal processor apparatus of FIG. 20 has the same operational characteristics as the sensor signal processor apparatus of FIG. 19. However, the sensor signal processor apparatus of FIG. 20 can be used in a system that measures a plurality of properties simultaneously using various capacitive sensors.

Referring to FIG. 20, the sensor signal processor apparatus includes a plurality of ramp integrators 431 through 435, a plurality of digital comparators 441 through 445, and a controller 450. The comparators 441 through 445 compare an internal or external voltage $V_{SR}$ with voltages $V_{CS1}$ through $V_{CSn}$ received from the ramp integrators 431 through 435.

FIG. 21 is a circuit diagram illustrating an exemplary circuit structure of the sensor signal processor apparatus of FIG. 19.

In the current embodiment, the sensor signal processor apparatus (an interface for processing a sensor signal) is constructed using a ramp integrator 430 and a digital comparator 440.

The circuit structure of FIG. 21 for the sensor signal processor apparatus includes the ramp integrator 430, the digital comparator 440, and a controller 450. The ramp integrator 430 includes a current source ($I_{CS}$) generating a constant current, a capacitive sensor ($C_{S1}$) receiving a current $I_{CS}$ from the current source, and a switch $S_R$ for charging and discharging the capacitive sensor ($C_{S1}$). The digital comparator 440 compares a voltage $V_{SC}$ of the ramp integrator 430 with a predetermined voltage. The controller 450 receives an output signal $V_{C1}$ of the digital comparator 440 and generates a control signal $V_{EN}$ for on-off controlling the ramp integrator 430.

The circuit structure of FIG. 21 can be expressed by Equation 14 that is equal to Equation 9 for the circuit structure of FIG. 15. However, the digital comparator 440 uses two threshold voltages $V_{thH}$ and $V_{thL}$, and thus the output signal $V_{C1}$ of the digital comparator 430 varies in association with the threshold voltages $V_{thH}$ and $V_{thL}$.

$$V_{SC1} = \frac{I_{CS}}{C_{S1}}T_{C1} \quad \text{[Equation 14]}$$

In detail, the digital comparator 440 has a high threshold voltage $V_{thH}$ and a low threshold voltage $V_{thL}$. The digital comparator 440 compares the voltage $V_{SC1}$ of the ramp integrator 430 with the high threshold voltage $V_{thH}$.

The voltage level of an output signal $V_{C1}$ of the comparator 440 changes when the two voltages $V_{thH}$ and $V_{SC1}$ are of the same level. That is, the voltage level of the output signal $V_{C1}$ of the comparator 440 changes from 1 to 0. The voltage level of the output signal $V_{C1}$ of the comparator 440 changes at a time $T_{C1}$. That is, the level of the voltage $V_{SC1}$ increases with time from zero level (when time=0) to a high level. This can be expressed by Equation 15 below.

$$T_{C1} = \frac{V_{thH}}{I_{CS}}C_{S1}, V_{CS1} = V_{thH} \quad \text{[Equation 15]}$$

Output values of the capacitive sensor can be detected by counting the number of pulses of a clock signal of the controller 450 for the time $T_{C1}$. Detection precision can be increased by using a clock signal having a high frequency. Furthermore, an additional power source for a reference voltage is not necessary since the digital comparator 440 is used.

FIG. 22 is circuit diagram illustrating an exemplary circuit structure for the sensor signal processor apparatus of FIG. 20. The circuit structure of FIG. 22 provides two interfaces as compared with the circuit structure of FIG. 21 providing an interface.

Referring to FIG. 22, the sensor signal processor apparatus includes ramp integrators 431 and 432, digital comparators 441 and 442, and a controller 450 that have the same structures as those of the elements of the sensor signal processor apparatus of FIG. 21.

The operation of the sensor signal processor apparatus of FIG. 22 can be expressed by the same mathematical model as that for the operation of the sensor signal processor apparatus of FIG. 21. However, the sensor signal processor apparatus of FIG. 22 can be more precise according to the configuration of the controller 450. For this, the controller 450 can include an AND gate and an EX-OR gate like the controller 250 of FIG. 11. In this case, a mathematical operation model of the sensor signal processor apparatus can be expressed with respect to times $T_{C1}$ and $T_{C2}$ where output voltages of the comparators 441 and 442 change, as shown by Equation 16 below.

$$\text{When } V_{thH} = V_{CS1}, T_{C1} = \frac{V_{CS1}}{I_{CS}} C_{CS1} \qquad \text{[Equation 16]}$$

$$\text{When } V_{thH} = V_{CS2}, T_{C2} = \frac{V_{CS2}}{I_{CS}} C_{CS2}$$

In the current embodiment, output values of resistance sensors can be measured by counting the number of pulses of a clock signal of the controller 450 for times $T_{C1}$ and $T_{C2}$, respectively. The controller 450 can be properly configured for an application system by using the respective times $T_{C1}$ and $T_{C2}$ of Equation 16. Alternatively, the controller 450 can be configured using a different $\Delta T$ between the times $T_{C1}$ and $T_{C2}$ as shown in Equation 17 below in order for precise measurement with less influence by external environment.

$$\Delta T = T_{C2} - T_{C1} \qquad \text{[Equation 17]}$$

$$= \left(\frac{C_{CS2} - C_{CS1}}{I_{CS}}\right) V_{thH}$$

In the current embodiment, the output values of the resistance sensors can be measured by counting the number of pulses of a clock signal of the controller 450 for time $\Delta T$. Environmental factors decreasing the performance of the sensor signal processor apparatus due to a sensor resistance difference can be removed. Signals that are output from the elements of the sensor signal processor apparatus of FIG. 22 according to Equations 16 have wave forms as illustrated in FIG. 18. However, the wave forms of output voltages $V_{C1}$ and $V_{C2}$ of the digital comparator 441 and 442 are inversed.

A comparator is necessary for the sensor signal processor apparatus of the present invention. Various comparators can be used according the circuit structure of the sensor signal processor apparatus. For example, in terms of supply power, comparators that can be used for the sensor signal processor apparatus of the present invention can be classified into comparators receiving positive and negative supply voltages and comparators receiving one of positive and negative supply voltages. Furthermore, according to application systems using the sensor signal processor apparatus, a comparator requiring two power sources or a comparator requiring a single power source can be used.

FIG. 23 illustrates a comparator 140 of a sensor signal processor apparatus according to an embodiment of the present invention. The comparator 140 uses a single supply power source. The comparator 140 can use two supply power sources by applying both positive and negative voltages with respect to the ground.

The comparator 140 can be widely used for processing a sensor signal using a single supply power source. The comparator 140 has a simple circuit structure, and it is easy to construct the comparator 140 using a semiconductor device. Particularly, the comparator 140 is characterized in that an input signal is biased using a p-channel metal oxide semiconductor (PMOS) device. Referring to FIG. 23, MOS devices M1 to M5 operate as a differential amplifier, and MOS devices M6 and M7 operate as a common-source amplifier. PMOS devices Mp1 and Mp2 and current sources ($I_S$) operate as a bias circuit. When input signals $V_{IN1+}$ and $V_{IN1-}$ are biased using the PMOS devices and the current sources, the comparator 140 can be mathematically modeled as shown by Equation 18 below.

$$V_{IN1+} = V_{IN+} + V_{SG1} = V_{IN+} + \left(\sqrt{\frac{I_D}{K_P}} + V_t\right) \qquad \text{[Equation 18]}$$

$$V_{IN1-} = V_{IN-} + V_{SG2} = V_{IN-} + \left(\sqrt{\frac{I_D}{K_P}} + V_t\right)$$

The biased input signals $V_{IN1+}$ and $V_{IN1-}$ are input to the differential amplifier and the common-source amplifier and are output as shown in Equation 19 below.

$$V_{IN+} > V_{IN-}, V_{IN1+} > V_{IN1-}, V_{out} = V_{dd}$$

$$V_{IN+} > V_{IN-}, V_{IN1+} > V_{IN1-}, V_{out} = 0 \qquad \text{[Equation 19]}$$

The comparator 140 is characterized by high impedance at an input terminal and a simple circuit structure. In addition, the comparator 140 can be easily constructed using a semiconductor device such as a MOS device and a bipolar device.

FIG. 23 illustrates a comparator 140 of a sensor signal processor apparatus according to an embodiment of the present invention. The comparator 140 uses a single supply power source. The comparator 140 can use two supply power sources by applying both positive and negative voltages with respect to the ground.

FIG. 24 illustrates an application example of the comparator 140 of FIG. 23 using a single supply power source having two current sources.

FIG. 25 illustrates an exemplary circuit structure of a comparator using a single supply power source having four current sources, and FIG. 26 illustrates an application example of the comparator of FIG. 25.

The comparator of FIG. 25 has the same mathematical model as that of the FIG. 23. However, the comparator of FIG. 25 is configured without a resistor.

FIGS. 27 and 28 illustrate an exemplary structure of the digital comparator 440 according to an embodiment of the present invention.

The digital comparator 440 receives a single input signal and outputs a single output signal. The digital comparator 440 uses a high threshold voltage and a low threshold voltage. FIGS. 27 and 28 illustrate an exemplary digital comparator that can be used in the sensor signal processor apparatus of the present invention. In the case of using the digital comparator 440 in the sensor signal processor apparatus of the present invention, an additional power source is not necessary since the digital comparator 440 can perform a comparing operation on a single input signal, as compared with the case of using a comparator requiring two input signals for performing a comparing operation.

FIG. 29 illustrates an application system 180 and a sensor signal processor apparatus 100 that are connected to each other according to an embodiment of the present invention.

Referring to FIG. 29, the sensor signal processor apparatus 100 includes a sensor 120, an interface 170, and a controller 150. The sensor signal processor apparatus 100 is connected to the application system 180 to provide a processed sensor signal to the application system 180.

Application systems such as a measuring system and an information security system can be constructed more easily and simply by using the sensor signal processor apparatus of the present invention. For example, when the application system 180 is a display device requiring a temperature measurement mechanism, the application system 180 can be easily provided with the temperature measurement mechanism by constructing the sensor signal processor apparatus 100 to process an output signal of a temperature sensor. When the application system 180 is a security chip, the sensor signal processor apparatus 100 can be constructed to provide information protection functions to the application system 180.

FIG. 30 illustrates application examples of sensor signal processor apparatuses to various chips according to embodiments of the present invention.

Referring to FIG. 30(a), a controller 150, an interface 170, and a sensor 120 of a sensor signal processor apparatus are embedded in a chip 1100. Referring to FIG. 30(b), a controller 150 and an interface 170 of a sensor signal processor apparatus are embedded in a chip 1100, and a sensor 120 of the sensor signal processor apparatus is separated from the chip 1200.

Referring to FIG. 30(c), a controller 150, interfaces 171 and 175, and sensors 121 and 125 of a sensor signal processor apparatus are embedded in a chip 1300.

Referring to FIG. 30(d), a controller 150 and interfaces 171 and 175 of a sensor signal processor apparatus are embedded in a chip 1400, and sensors 121 and 125 of the sensor signal processor apparatus are separated from the chip 1400.

FIG. 31 illustrates a relationship between a terminal 1800 and an information security chip 100 including a sensor signal processor apparatus according to an embodiment of the present invention.

The information security chip 100 is embedded in the terminal 1800 for the purpose of security.

Referring to FIG. 31, the information security chip 100 can be embedded in the terminal 1800 for the purpose of security through the following procedures: a sensor security device is embedded in the terminal 1800 during a manufacturing process (S100); and the terminal 1800 is authenticated in response to a user's request (S200).

In detail, the terminal 1800 requests initial value setting (S110). Then, a manufacturer embeds the information security chip 100 into the terminal 1800 and sets a sensor using an initial value, and the information security chip 100 measures the set initial value and stores the measured initial value (S120).

The measured initial value is transmitted to the terminal 1800 (S130). Then, the terminal 1800 performs initial value setting using the received initial value (S140).

Thereafter, the terminal 1800 is sold to a user. To safely use the terminal 1800, the user requests security authentication (S210). Then, the information security chip 100 embedded in the terminal 1800 compares the initial value (Si) of the sensor with an authentication sensor value (SA) (S220). The information security chip 100 analyzes a chip state using the comparison result and informs the terminal 1800 of the analysis result (s230). Then, the terminal 1800 determines whether it is authenticated or not by using the comparison result and reports the determination result to the user (S240).

FIG. 32 is a view for explaining a method of authenticating an information security chip 100 without association with a terminal according to an embodiment of the present invention.

The information security chip 100 can be embedded in a smart card for physical safety.

First, the information security chip 100 is manufactured by embedding a sensor security device into the information security chip 100 (S300). For this, a user measures and stores an initial value of a sensor (S310).

Next, the sensor security device authenticates the information security chip 100 in response to a user's request (S400).

For this, the sensor security device compares an initial value (Si) of the sensor with an authentication sensor value (SA) (S410) and determines from the comparison result whether the information security chip 100 is hacked (S420).

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. A sensor signal processor apparatus comprising:
a current source generating a constant current according to a preset value;
a sensor outputting a sensor voltage using the current from the current source;
a ramp integrator generating and outputting an integral voltage according to an input command;
a comparator comparing the sensor voltage output from the sensor with the integral voltage output from the ramp integrator and outputting a result of the comparison; and
a controller controlling the generating and outputting of the integral voltage of the ramp integrator according to the comparison result of the comparator.

2. The sensor signal processor apparatus of claim 1, further comprising at least one current source, at least one sensor, and at least one comparator.

3. The sensor signal processor apparatus of claim 1, wherein the sensor is one of a resistance sensor, a capacitive sensor, and an inductance sensor that are capable of collecting different information.

4. The sensor signal processor apparatus of claim 1, wherein the ramp integrator comprises a capacitor and a switch that are connected in parallel, and the integral voltage is generated by charging the capacitor using the current generated by the current source.

5. The sensor signal processor apparatus of claim 4, wherein the controller comprises:
an EX-OR gate generating a pulse signal in response to an output signal of the comparator; and
a NAND gate controlling a switch of the ramp integrator connected to a capacitor of the ramp integrator in parallel.

6. The sensor signal processor apparatus of claim 1, wherein the comparator comprises two p-channel metal oxide semiconductor (PMOS) transistors or two PNP transistors for biasing an input signal voltage using a power source having two current sources.

7. The sensor signal processor apparatus of claim 1, wherein the controller is formed into a semiconductor chip.

8. A sensor signal processor apparatus comprising:
a sensor including a sensor resistor;
a ramp integrator including a current source generating a constant current according to a resistance of the sensor resistor, the ramp integrator generating and outputting an integral voltage based on the current generated by the current source in response to an input command;
a digital comparator performing an comparison operation on the integral voltage output from the ramp integrator and outputting a result of the comparison; and a controller controlling the generating and outputting of the integral voltage of the ramp integrator according to the comparison result of the digital comparator.

9. The sensor signal processor apparatus of claim 8, further comprising at least one sensor, at least one ramp integrator, and at least one digital comparator.

10. The sensor signal processor apparatus of claim 8, wherein the sensor is one of a resistance sensor, a capacitive sensor, and an inductance sensor that are capable of collecting different information.

11. The sensor signal processor apparatus of claim 8, wherein the digital comparator comprises an analog or digital Schmitt trigger.

12. The sensor signal processor apparatus of claim 8, wherein the ramp integrator comprises a capacitor and a switch that are connected in parallel, and the integral voltage is generated by charging the capacitor using the current generated by the current source.

13. The sensor signal processor apparatus of claim 12, wherein the controller comprises:
an EX-OR gate generating a pulse signal in response to an output signal of the comparator; and
an AND gate controlling a switch of the ramp integrator connected to a capacitor of the ramp integrator in parallel.

14. A sensor signal processor apparatus comprising:
a ramp integrator generating and outputting an integral voltage for a sensor;
a plurality of comparators comparing the integral voltage of the ramp integrator with arbitrary input voltages; and
a controller controlling the generating and outputting of the integral voltage of the ramp integrator according to outputs of the comparators.

15. The sensor signal processor apparatus of claim 14, wherein the ramp integrator comprises:
a current source generating a constant current;
a capacitor receiving the current generated from the current source for charging; and
a switch used to charge and discharge the capacitor.

16. The sensor signal processor apparatus of claim 14, further comprising at least one ramp integrator.

17. The sensor signal processor apparatus of claim 14, wherein the arbitrary input voltages to the plurality of comparators are common voltages having the same potential level.

18. The sensor signal processor apparatus of claim 14, wherein the ramp integrator comprises a capacitor and a switch that are connected in parallel, and the integral voltage is generated by charging the capacitor using the current generated by the current source.

19. The sensor signal processor apparatus of claim 18, wherein the controller comprises:
an EX-OR gate generating a pulse signal in response to an output signal of the comparator; and
a NAND gate controlling a switch of the ramp integrator connected to a capacitor of the ramp integrator in parallel.

20. A sensor signal processor apparatus comprising:
a ramp integrator including a current source generating a constant current, a capacitive sensor receiving the current generated from the current source for charging, and a switch used to charge and discharge the capacitive sensor;
a digital comparator performing an comparison operation on an integral voltage output from the ramp integrator and outputting a result of the comparison; and
a controller controlling generating and outputting of the integral voltage of the ramp integrator according to the comparison result of the digital comparator.

21. The sensor signal processor apparatus of claim 20, wherein the digital comparator comprises an analog or digital Schmitt trigger.

22. The sensor signal processor apparatus of claim 20, further comprising at least one ramp integrator and at least one digital comparator.

23. The sensor signal processor apparatus of claim 20, wherein the ramp integrator comprises a capacitor and a switch that are connected in parallel, and the integral voltage is generated by charging the capacitor using the current generated by the current source.

24. The sensor signal processor apparatus of claim 23, wherein the controller comprises:
an EX-OR gate generating a pulse signal in response to an output signal of the comparator; and
an AND gate controlling a switch of the ramp integrator connected to a capacitor of the ramp integrator in parallel.

* * * * *